(12) United States Patent
Furuhata

(10) Patent No.: US 6,673,678 B2
(45) Date of Patent: Jan. 6, 2004

(54) NON-VOLATILE SEMICONDUCTOR MEMORY DEVICE AND MANUFACTURING METHOD THEREOF

(75) Inventor: Tomoyuki Furuhata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/956,893

(22) Filed: Sep. 21, 2001

(65) Prior Publication Data

US 2002/0011623 A1 Jan. 31, 2002

Related U.S. Application Data

(62) Division of application No. 09/273,500, filed on Mar. 22, 1999.

(30) Foreign Application Priority Data

Mar. 20, 1998 (JP) ............................................ 10-092489

(51) Int. Cl.[7] ............................................... H01L 21/30
(52) U.S. Cl. ........................ 438/258; 438/257; 438/266; 257/326
(58) Field of Search ................................ 438/257, 266, 438/258; 257/326

(56) References Cited

U.S. PATENT DOCUMENTS

| | | | | |
|---|---|---|---|---|
| 4,833,096 A | * | 5/1989 | Huang et al. ........... | 257/E29.04 |
| 4,997,777 A | * | 3/1991 | Boivin .................... | 257/E29.04 |
| 5,216,268 A | | 6/1993 | Chen et al. ............... | 257/315 |
| 5,297,082 A | | 3/1994 | Lee ........................... | 365/185 |
| 5,326,999 A | | 7/1994 | Kim et al. .................. | 275/315 |
| 5,495,441 A | | 2/1996 | Hong ..................... | 365/185.01 |
| 5,554,862 A | | 9/1996 | Omura et al. ............... | 257/137 |
| 5,568,422 A | | 10/1996 | Fujiwara ................. | 365/185.33 |
| 5,610,419 A | | 3/1997 | Tanaka ....................... | 257/315 |
| 5,661,057 A | | 8/1997 | Fujiwara .................... | 438/257 |
| 5,675,161 A | | 10/1997 | Thomas ..................... | 257/316 |
| 5,698,879 A | | 12/1997 | Aritome et al. ............ | 257/315 |
| 5,780,341 A | | 7/1998 | Ogura ....................... | 438/259 |
| 5,843,796 A | | 12/1998 | Disney .......................... | 437/6 |
| 6,001,692 A | | 12/1999 | Gil ............................. | 438/279 |
| 6,022,779 A | | 2/2000 | Shin et al. ................... | 438/275 |
| 6,027,971 A | | 2/2000 | Cho et al. ................... | 438/257 |
| 6,057,194 A | | 5/2000 | Fulford, Jr. et al. ....... | 438/270 |
| 6,057,580 A | | 5/2000 | Watanabe et al. .......... | 257/396 |
| 6,087,706 A | | 7/2000 | Dawson et al. ............ | 257/520 |
| 6,103,577 A | | 8/2000 | Horng ....................... | 438/262 |
| 6,265,266 B1 | * | 7/2001 | Dejenfelt et al. ........... | 438/258 |

FOREIGN PATENT DOCUMENTS

JP     A-6-275847     9/1994

* cited by examiner

*Primary Examiner*—Amir Zarabian
*Assistant Examiner*—Jeff Vockrodt
(74) *Attorney, Agent, or Firm*—Oliff & Berridge, PLC

(57) ABSTRACT

The method of manufacturing a non-volatile semiconductor memory device comprises a step of providing a first ion implantation on the principal surface of a silicon substrate in a manner to cover a groove to form a first impurity region on the principal surface. Next, a step of providing a second ion implantation to cover the groove to form a second impurity region on the principal surface that overlaps the first impurity region at the groove and electrically connects the second source/drain region and the third source/drain region by the first impurity region. In short, the impurity region at the groove is formed by a twice ion implantation of the first and second ion implantations.

14 Claims, 18 Drawing Sheets

NON-VOLATILE SEMICONDUCTOR MEMORY DEVICE AND MANUFACTURING METHOD THEREOF

BACKGROUND OF THE INVENTION

1. Industrial Applicability

The present invention relates to a method of manufacturing a non-volatile semiconductor memory device for storing information by accumulation of an electric charge. More specifically, the present invention relates to a method of manufacturing a non-volatile semiconductor memory device in which a memory element is selectively activated by a field effect transistor, and to the non-volatile semiconductor memory device manufactured by accordance with this method.

2. Description of the Background Art

As a non-volatile semiconductor memory device having memory elements provided with floating gates and control gates, flash memory can be mentioned as an example. A variety of designs are available for flash memories, one of which is a device in which a memory element is selectively activated by a field effect transistor. A flash memory with such a configuration has been disclosed, for example, in Japanese Patent Application Laid-Open No. 6-275847/1994. In the following, a method of manufacturing the flash memory disclosed in Japanese Patent Application Laid-Open No. 6-275847/1994 is described with reference to FIGS. 44 to 52.

As shown in FIG. 44, on a principal surface of a semiconductor substrate 200, a silicon oxide layer 202 as a tunnel oxide layer is grown, and then a polysilicon layer 204 as a floating gate is formed. Part of the polysilicon layer 204 that is positioned over an access transistor formation region 232 is selectively etched as shown in FIG. 45, and remaining part of the polysilicon layer 204 positioned over a memory element formation region 234 is left. This remaining part of the polysilicon layer 204 is hereinafter referred to as a polysilicon layer 204a. As shown in FIG. 46, an ONO-layer 206 is formed on the polysilicon layer 204a, and a silicon oxide layer 208 as a gate oxide layer is formed over the access transistor formation region 232. Subsequently, a polysilicon layer 210 is formed on the ONO-layer 206 and the silicon oxide layer 208.

As shown in FIG. 47, a resist 212 is prepared on the polysilicon layer 210, which is then selectively etched by using the resist 212 as a mask, thereby forming a gate electrode 214 over the access transistor formation region 232 while leaving part of the polysilicon layer 210 that is positioned over the memory element formation region 234. The remaining part of the polysilicon layer 210 over the memory element formation region 234 is hereinafter referred to as a polysilicon layer 210a. This etching exposes the silicon oxide layer 208 on a principal surface 236 of the semiconductor substrate 200, in the area between the gate electrode 214 and a floating gate to be formed in a later step. Next, as shown in FIG. 48, the resist 212 is removed and a resist 216 is prepared over the memory element formation region 234 and the access transistor formation region 232. The resist 216 is patterned so that it provides a mask for forming a control gate.

Note that the resist 216 is patterned so that it covers the gate electrode 214, while at the same time its side surface 216a does not overlap the polysilicon layers 204a and 210a. The gate electrode 214 has to be covered because the gate electrode 214 is formed of a material identical to that of the control gate and the floating gate, i.e. polysilicon, and therefore has to be protected from being etched away during the etching step to form the control gate and the floating gate. The patterning is provided in such a way that the side surface 216a does not overlap the polysilicon layers 204a and 210a because, when the polysilicon layers 204a and 210a are etched later to form the control gate and the floating gate, unnecessary polysilicon layers 204a and 210a are left on the principal surface of the semiconductor substrate 200 if the side surface 216a overlaps the polysilicon layers 204a and 210a. Consequently, the resist 216 is patterned while maintaining the silicon oxide layer 208 exposed on a principal surface 236 of the semiconductor substrate 200, in the area between the gate electrode 214 and a floating gate to be formed in a later step.

The polysilicon layer 210a is selectively etched by using the resist 216 as a mask to form a control gate 218. The ONO-layer 206 is then selectively etched by using the resist 216 as a mask, as shown in FIG. 49. This etching removes the exposed portion of the silicon oxide layer 208 and exposes the principal surface 236 in the area between the gate electrode 214 and a floating gate to be formed in a later step.

As shown in FIG. 50, the polysilicon layer 204a is selectively etched by using the resist 216 as a mask, thereby forming a floating gate 220. Since the principal surface 236 is exposed, the principal surface 236 is also etched to unavoidably form a groove section 222 on the principal surface 236. Subsequently, an ion implantation is provided on the principal surface of the semiconductor substrate 200 using the resist 216 as a mask, thereby forming a source/drain region 224 in the memory element formation region 234 as well as an impurity region 226 electrically connected to the source/drain region 224 in the groove section 222.

A silicon oxide layer 228 is grown on the principal surface of the semiconductor substrate 200 as shown in FIG. 51, followed by the formation of a contact hole 238 on the silicon oxide layer 228 so that the source/drain region 224 is exposed. As shown in FIG. 52, an aluminum wiring layer 230 is then provided on the silicon oxide layer 228. The aluminum wiring layer 230 is also formed on the contact hole 238 and is electrically connected to the source/drain region 224. A memory element 242 is provided with the control gate 218, the floating gate 220, and the source/drain region 224, whereas an access transistor 244 is provided with the gate electrode 214 and the source/drain region 240.

Referring to FIG. 52, for selectively activating the memory element 242 with the access transistor 244, the source/drain region 240 of the access transistor 244 and the source/drain region 224 of the memory element 242 are electrically connected through the impurity region 226 formed within the groove section 222. Since the wiring region comprising the source/drain region 240, the impurity region 226, and the source/drain region 224 has an irregular shape due to the presence of the groove section 222, the diffusion resistance of the impurity region 226 significantly affects the diffusion. resistance of the wiring region. In the meantime, as described with reference to FIG. 50, the source/drain region 224 and the impurity region 226 are formed simultaneously by a single ion implantation. Since this implantation is performed under the conditions for depth and concentration of impurities required for forming the source/drain region 224, the depth and concentration of impurities at the impurity region 226 are not at the adequate levels required for the region. This leads to undesirable consequences where, for example, a high diffusion resistance at the impurity region 226 slows the speed of programming, erasing, and reading of the memory element 242.

SUMMARY OF THE INVENTION

The present invention has been made to eliminate the above-described problems with the prior art. Accordingly, an object of the present invention is to provide a non-volatile semiconductor memory device and a manufacturing method thereof, wherein at least one of either the source/drain region of the access transistor or source/drain region of the memory element can be formed with a required thickness and concentration of impurity, and also the diffusion resistance of the impurity region formed at the groove section can be lowered.

The present invention provides a manufacturing method of a non-volatile semiconductor memory device comprising: at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:

a step of forming a tunnel insulation layer on the first region;

a step of forming on the tunnel insulation layer a first conductive layer which becomes the floating gate;

a step of forming a dielectric layer on the first conductive layer;

a step of forming a gate insulation layer on the second region;

a step of forming a second conductive layer on the dielectric layer and the gate insulation layer;

a step of forming the control gate and the gate electrode by selectively etching the second conductive layer; and a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:

a step of performing a first ion implantation in the semiconductor substrate in a manner to cover the groove section so that a first impurity region is formed in the semiconductor substrate; and a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region.

According to the method of manufacturing a non-volatile semiconductor memory device of the present invention, the first impurity region is formed on the principal surface by a first ion implantation provided over the area of the groove section, and subsequently the second ion implantation is performed over the area of the groove section, thereby forming on the principal surface the second impurity region which overlaps the first impurity region at the groove section and at the same time electrically connects the second source/drain to the third source/drain with the first impurity region. The impurity region at the groove section comprises the first and second impurity regions which overlap one other. Since the impurity region at the groove section is formed by a two-step doping of the first and second ion implantations, this helps lower the diffusion resistance. Consequently, the speed of programming, erasing, and reading of the memory element can be improved. Meanwhile, since the impurity regions at the groove section are formed separately by the first and second ion implantations, the second ion implantation can be performed under conditions that provide for the depth and concentration of impurities required for the source/drain to be formed by the ion implantation.

As an aspect of the method of manufacturing a non-volatile semiconductor memory device of the present invention, it is preferable that the first impurity region is formed by performing the first ion implantation using the first resist and the second resist as masks, the first resist covering the first region in which the first source/drain is formed; and a side surface of the first resist being positioned on the control gate, the second resist covering the second region in which the fourth source/drain is formed; and a side surface of the second resist being positioned between the gate electrode and the groove section;

the first, third, and fourth source/drain regions, and the second impurity regions are formed by performing the second ion implantation in the semiconductor substrate using the control gate and the gate electrode as masks; and the second source/drain region is formed by performing the first and the second ion implantations. Since the first, third, and fourth source/drain regions are formed by the second ion implantation, these regions can be provided with the depth and concentration of impurities required for the respective source/drain region. Moreover, since the side surface of the first resist is not positioned between the control gate and the groove section, it dispenses with the need to consider the mask alignment margin, which enables shortening the distance between the control gate and the groove section, thereby achieving a high cell density and a high degree of integration for the non-volatile semiconductor memory device.

As another aspect of the method of manufacturing a non-volatile semiconductor memory device of the present invention, it is preferable that the first impurity region is formed by performing the first ion implantation using a third resist and a forth resist as masks, the third resist covering the first region in which the first source/drain region is formed; and a side surface of the third resist being positioned between the control gate and the groove section, the fourth resist covering the second region in which the fourth source/drain region is formed; and a side surface of the forth resist being positioned between the gate electrode and the groove section; and the first, second, third, and fourth source/drain regions, and the second impurity regions are formed by performing the second ion implantation in the semiconductor substrate using the control gate and the gate electrode as masks.

As yet another aspect of the method of manufacturing a non-volatile semiconductor memory device of the present invention, it is preferable that the first impurity region is formed by performing the first ion implantation using a fifth resist and a sixth resist as masks, the fifth resist covering the first region in which the first source/drain region is formed; and a side surface of the fifth resist being positioned on the control gate, the sixth resist covering the second region in which the fourth source/drain region is formed; and a side surface of the sixth resist being positioned on the gate electrode;

the first and fourth source/drain regions and the second impurity region are formed by performing the second ion implantation in the semiconductor substrate using the control gate and the gate electrode as masks; and the second and third source/drain regions are formed by performing the first and second ion implantations. Since the first and fourth source/drain regions are formed with the second ion implantation, these regions can be provided with the depth and concentration of impurities required for the respective source/drain region. Moreover, since the side surface of the fifth resist is not positioned between the control gate and the groove section, this dispenses with the need to consider the mask alignment margin, which enables shortening the distance between the control gate and the groove section. Furthermore, since the side surface of the sixth resist is not positioned between the gate electrode and the groove section, there is no need to allow for the mask alignment margin, which enables shortening the distance between the gate electrode and the groove section. Consequently, the present embodiment enables achieving a higher cell density and a higher degree of integration for the nonvolatile semiconductor memory device than in the preferred embodiments of the present invention previously described.

As yet another aspect of the method of manufacturing a non-volatile semiconductor memory device of the present invention, it is preferable that the first impurity region is formed by performing the first ion implantation using a seventh resist and a eighth resist as masks, the seventh resist covering the first region in which the first source/drain region is formed; and a side surface of the seventh resist being positioned between the control gate and the groove section, the eighth resist covering the second region in which the fourth source/drain region is formed; and a side surface of the eighth resist being positioned on the gate electrode;

the first, second, and fourth source/drain regions and the second impurity region are formed by performing the second ion implantation in the semiconductor substrate using the control gate and the gate electrode as masks; and the third source/drain region is formed by performing the first and second ion implantations. Since the first, second, and fourth source/drain regions are formed with the second ion implantation these regions can be provided with the depth and concentration of impurities required for the respective source/drain. Moreover, since the side surface of the eighth resist is not positioned between the gate electrode and the groove section, this dispenses with the need to consider the mask alignment margin, which enables shortening the distance between the gate electrode and the groove section. Consequently, as with other embodiments of the present invention previously described, the present embodiment enables achieving a high cell density and a high degree of integration for the non-volatile semiconductor memory device.

As yet another aspect of the method of manufacturing a non-volatile semiconductor memory device of the present invention, it is preferable that the first and second source/drain regions and the first impurity region are formed by performing the first ion implantation using the control gate and a ninth resist as masks, the ninth resist covering the second region in which the fourth source/drain region is formed; and a side surface of the ninth resist being positioned between the gate electrode and the groove section; and the third and fourth source/drain regions and the second impurity region are formed by performing the second ion implantation using the gate electrode and a tenth resist as masks, the tenth resist covering the first region in which the first source/drain region is formed; and a side surface of the tenth resist being positioned between the control gate and the groove section. Since the first and second source/drain regions are formed by performing the first ion implantation and the third and fourth source/drain regions are formed by the second ion implantation, the first, second, third, and fourth source/drain regions can be provided with the depth and concentration of impurities required for the respective source/drain region.

Yet another aspect of the method of manufacturing a non-volatile semiconductor memory device of the present invention may comprise: prior to the step of forming the tunnel insulation layer, a step of forming on the principal surface an element-isolating insulation layer that includes a side portion located in the first and second regions and isolates the memory element and the access gate transistor from other memory element and other access gate transistor, wherein the step of forming the first impurity region includes the first ion implantation using as a mask an eleventh resist that covers the element-isolating insulation layer, the side surface of the eleventh resist being positioned outside the side portion of the element-isolating insulation layer.

When forming the first impurity region in a deep position, ions have to be implanted at a high energy level. However, since the element-isolating insulation layer alone cannot stop the ions piercing through the element-isolating insulation layer to reach the semiconductor substrate, the element-isolating insulation layer eventually loses its function of element isolation. Accordingly, a resist is formed on the element-isolating insulation layer, and the first ion implantation is performed using this resist as a mask to form the first impurity region. If the side surface of the resist is positioned inside the side portion of the element-isolating insulation layer at the time of the first ion implantation, the first impurity region can also be formed underneath the side portion of the element-isolating insulation layer to punch through other impurity regions. In the present embodiment, however, since the first impurity region is formed by performing the first ion implantation using the eleventh resist as a mask which covers the element-isolating insulation layer with the side surface of the resist being positioned outside the side portion of the element-isolating insulation layer, a distance is created between the side surface of the first impurity region and the side portion of the element-isolating insulation layer. Consequently, the first impurity region can be prevented from diffusing underneath the element-isolating insulation layer to punch through other impurity regions, even if the first impurity region is formed in a deep position. In this configuration, the distance from the side surface of the eleventh resist to the side portion of the element-isolating insulation layer is preferably 0.1 μm or more and 0.3 μm or less. Moreover, it is preferable to apply the present invention when the width of the element-isolating insulation layer is 2 to 3 μm or less.

As yet another aspect of the method of manufacturing a non-volatile semiconductor memory device of the present invention, it is preferable that serial steps for forming the second conductive layer up to forming the floating gate comprising:

a step of forming a twelfth resist on the second conductive layer, after a step of forming the second conductive layer;

a step of selectively etching the second conductive layer using the twelfth resist as a mask to leave a portion of the second conductive layer on the first region, and to form the gate electrode;

a step of forming a thirteenth resist on the second conductive layer in the first region and to cover the gate electrode;

a step of selectively etching the second conductive layer using the thirteenth resist as a mask to form the control gate; and a step of selectively etching the first conductive layer using the thirteenth resist as a mask to form the floating gate.

As yet another aspect of the method of manufacturing a non-volatile semiconductor memory device of the present invention, it is preferable that serial steps for forming the second conductive layer up to forming the floating gate comprising:

a step of forming a first insulation layer on the second conductive layer, after a step of forming the second conductive layer;

a step of forming a fourteenth resist on the first insulation layer; and a step of selectively etching the first insulation layer and the second conductive layer using the fourteenth resist as a mask to simultaneously form the control gate and the gate electrode, wherein the first insulation layer remains on the control gate and the gate electrode, and wherein the serial steps further include:
a step of forming a fifteenth resist so as to cover the gate electrode; and
a step of selectively etching the first conductive layer using the first insulation layer on the control gate and the fifteenth resist as masks to form the floating gate.

When the control gate and the gate electrode are formed separately, there is a need to consider the margin for aligning the mask for forming the control gate and the mask for forming the gate electrode. This necessitates a certain distance allowing the mask alignment to be placed between the control gate and the gate electrode. In the present embodiment, however, since the control gate and the gate electrode are simultaneously formed, there is no need to consider the margin for aligning the masks for forming the control gate and the gate electrode. Consequently, the distance between the control gate and the gate electrode can be reduced to contribute to microminiaturization of the non-volatile semiconductor memory device.

As yet another aspect of the method of manufacturing a non-volatile semiconductor memory device of the present invention, it is preferable that serial steps for forming the second conductive layer up to forming the floating gate comprising:

a step of forming a second insulation layer on the second conductive layer, after a step of forming the second conductive layer;

a step of forming a sixteenth resist on the second insulation layer;

a step of selectively etching the second insulation layer using the sixteenth resist as a mask; and a step of selectively etching the second conductive layer using the second insulation layer as a mask to simultaneously form the control gate and the gate electrode, wherein the second insulation layer remains on the control gate and the gate electrode, and wherein the serial steps further include:
a step of forming a seventeenth resist so as to cover the gate electrode; and
a step of selectively etching the first conductive layer using the second insulation layer on the control gate and the seventeenth resist as masks to form the floating gate. For yet unknown reasons, etching can be performed more accurately by masking with an insulation layer, rather than with a resist. Since the present embodiment forms the control gate using the second insulation layer as a mask, it is able to form a control gate of a more accurate shape than a method using a resist as a mask.

As yet another aspect of the method of manufacturing a non-volatile semiconductor memory device of the present invention, non-volatile semiconductor memory device preferably comprise a plurality of the memory elements and a plurality of the access gate transistors, each one of the access gate transistors selectively activating only one memory element.

As yet another aspect of the method of manufacturing a non-volatile semiconductor memory device of the present invention, it is preferable that the groove section is formed to a depth of between 100 to 300 nm;

the step for forming the first impurity region comprises:
the first ion implantation performed initially with phosphorus under conditions of an energy of 40 to 120 KeV and a dosage of $1E14/cm^2$ to $6E15/cm^2$, then with any one of phosphorus and arsenic under conditions of an energy of 30 to 80 KeV and a dosage of $1E15/cm^2$ to $6E15/cm^2$; and a step of thermally treating the implanted ion under $N_2$ or $N_2/O_2$ atmosphere, at a temperature between 900 and 950° C., and for a duration of 30 to 180 minutes to form the first impurity region having a thickness of 200 to 600 nm and an impurity concentration of $1E18/cm^3$ to $1E21/cm^3$; and the step for forming the second impurity region comprises:

the second ion implantation performed initially with phosphorus under conditions of an energy of 40 to 120 KeV and a dosage of $5E12/cm^2$ to $5E14/cm^2$, then with any one of phosphorus and arsenic under conditions of an energy of 30 to 80 KeV and a dosage of $1E15/cm^2$ to $6E15/cm^2$; and a step of forming the second impurity region having a thickness of 100 to 400 nm and an impurity concentration of $1E17/cm^3$ to $1E21/cm^3$.

The steps for forming the second impurity region in this embodiment comprise the second ion implantation performed initially with phosphorus and under conditions of energy of 40 to 120 KeV and a dosage of 5E12 to $5E14/cm^2$, then with either phosphorus or arsenic under conditions of 30 to 80 KeV and 1E15 to 6E15/cm$^2$, to form the second impurity region having a depth of 100 to 400 nm and an impurity concentration of 1E17 to 1E21/cm$^3$. Note that the thermal treatment for the diffused ions will be provided concurrently with a thermal treating step later in the manufacturing process.

The present invention farther provides a non-volatile semiconductor memory device storing information by an accumulation of electric charge, comprising:

a semiconductor substrate having a principal surface comprising a first region and a second region;

at least one memory element including: a floating gate formed in the first region; a control gate formed on the floating gate; a first source/drain region formed in the first region; and a second source/drain region formed in the first region apart from the first source/drain region, located by the floating gate and the control gate therebetween;

at least one access gate transistor for selectively activating the memory element, the access gate transistor comprising: a gate electrode formed in the second region; a third source/drain region formed in the second region; and a fourth source/drain region formed in the second region apart from the third source/drain region, located by the gate electrode therebetween, wherein a groove section is unavoidably formed in the semiconductor substrate between the floating gate and the gate electrode, and wherein the non-volatile semiconductor memory device further comprises an impurity region formed in the semiconductor substrate so as to cover the groove section, the impurity region electrically connecting the second source/drain region and the third source/drain region, and having a higher impurity concentration than the first and the fourth source/drain regions.

As an aspect of the non-volatile semiconductor memory device of the present invention, it is preferable that the impurity concentration in the impurity region is at least one-and-a-half times but not more than twice the impurity concentration in the first and fourth source/drain regions.

As another aspect of the non-volatile semiconductor memory device of the present invention, it is preferable that the impurity concentration in the impurity region is the same as the impurity concentration in the second source/drain region and higher than that in the first, third, and fourth source/drain regions.

As yet another aspect of the non-volatile semiconductor memory device of the present invention, it is preferable that the impurity concentration in the impurity region is higher than the impurity concentration in the first, second, third, and fourth source/drain regions.

As yet another aspect of the non-volatile semiconductor memory device of the present invention, it is preferable that the impurity concentration in the impurity region is the same as the impurity concentration in the second and third source/drain regions and higher than that in the first and fourth source/drain regions.

As yet another aspect of the non-volatile semiconductor memory device of the present invention, it is preferable that the impurity concentration in the impurity region is the same as the impurity concentration in the third source/drain region and higher than that in the first, second, and fourth source/drain regions.

Yet another aspect of the non-volatile semiconductor memory device of the present invention may comprise: an element-isolating insulation layer that is formed on the principal surface and includes a side portion located in the first and second regions and that isolates the memory element and the access gate transistor from other memory element and access gate transistor;

a first impurity region formed in the semiconductor substrate, and being apart from the element-isolating insulation layer; and a second impurity region formed in the semiconductor substrate so that a portion thereof overlaps the first impurity region, having a smaller thickness than the first impurity region, and being in contact with the element-isolating insulation layer. In this aspect, the distance between the element-isolating insulation layer and the first impurity region is preferably between 0.1 and 0.3 $\mu$m.

Note that when the word "on" is used to explain the positional relationship between two layers of the device in the present application, there may exist other layers between these two layers.

DETAILED DESCRIPTION OF THE PREFERRED EMBODIMENTS

Each of the embodiment examples described below is an application of the present invention to a non-volatile semiconductor memory device comprising a plurality of memory elements and a plurality of access transistors for selectively activating the memory elements in such a manner that each access transistor selectively activates only one memory element. However, the present invention is not limited to those described below but can be equally applied to non-volatile semiconductor memory devices wherein memory elements are selectively activated by access transistors of types such as NOR, NAND, or DINOR, for example.

Figure 3:
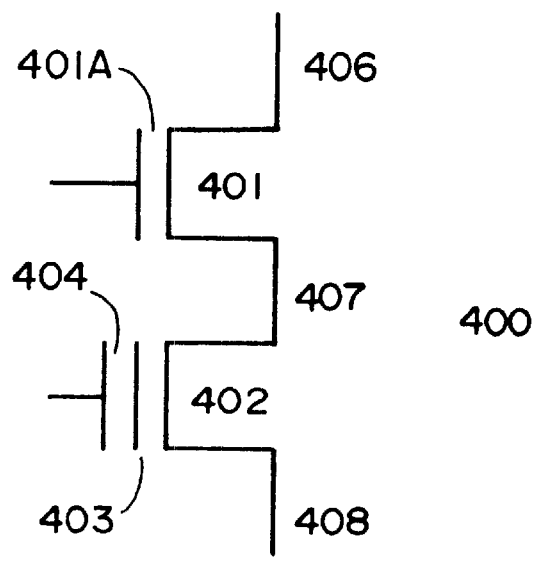
FIG. 3 is a schematic diagram of a memory cell comprising a flash memory manufactured by the first embodiment of the method of manufacturing a non-volatile semiconductor memory device of the present invention.
Figure 4:
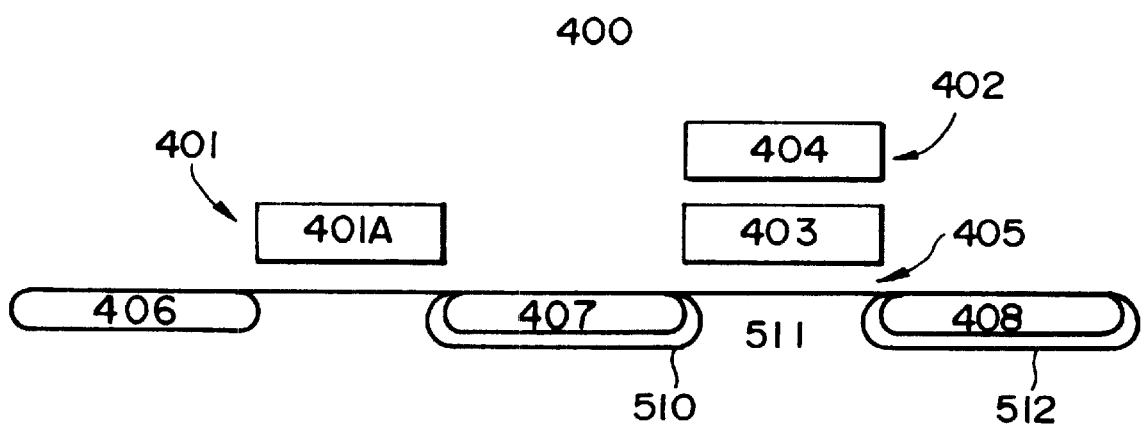
FIG. 4 is a schematic cross-sectional view of a memory cell comprising a flash memory manufactured by the first embodiment of the method of manufacturing a non-volatile semiconductor memory device of the present invention.
Figure 5:
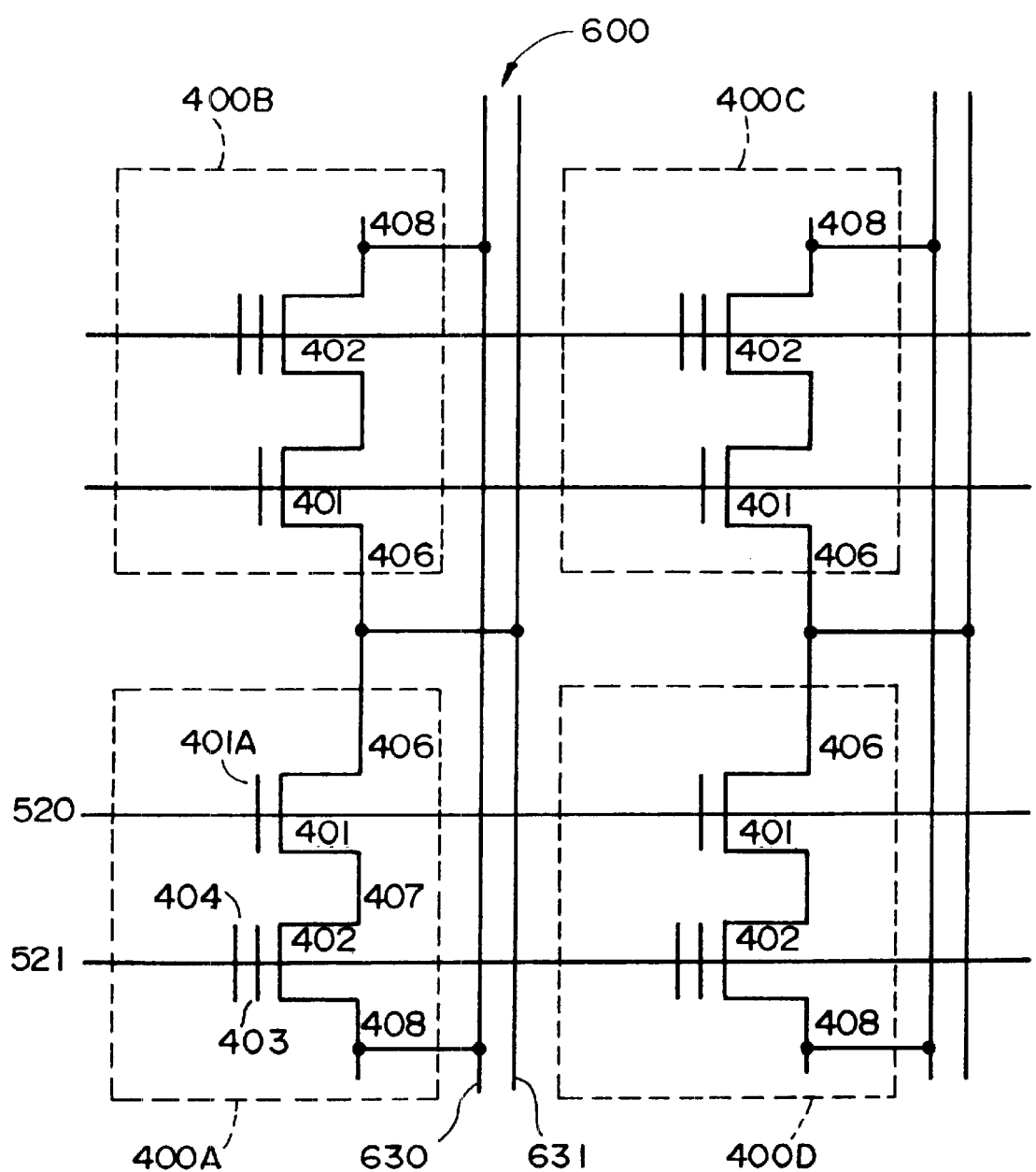
FIG. 5 is a schematic diagram of a memory cell array comprising a flash memory manufactured by the first embodiment of the method of manufacturing a non-volatile semiconductor memory device of the present invention.

Referring to FIGS. 3, 4, and 5, descriptions are first given on a non-volatile semiconductor memory device comprising a plurality of memory elements and a plurality of access transistors for selectively activating the memory elements in such a manner that each access transistor selectively activates only one memory element. FIG. 3 is a schematic view of a memory cell 400 of a flash memory of the above type. The memory cell 400 has an access transistor 401 and a memory transistor 402 which is a memory element. The access transistor 401 has a gate 401A and the memory transistor 402 has a floating gate 403 and a control gate 404. The access transistor 401 is an N-channel MOSFET with a threshold voltage of approximately 0.7 V.

Programming of the memory cell 400 by channel hot electron is achieved by simultaneously applying a high positive programming voltage $V_{pp}$, for example 5 to 12 V may be applied to the gate 401A of the access transistor 401 and 12 V to the control gate 404 of the memory transistor 402, while holding a source 408 of the memory transistor 402 at a ground potential $V_{ss}$, and applying a positive programming pulse to a drain 406 of the access transistor 401. A programming pulse of about 5 V can be applied for 100 microseconds, for example. Referring to FIG. 4, a drain 407 of the memory transistor 402 (which is also the source of the access transistor 401) has a high-concentration doping region 510. This ion implantation in the drain enhances the electric field in a channel region 511 close to the drain 407, thereby accelerating the electrons and generating a distribution of high energy electrons which are energetic enough to overcome the potential energy barrier for transfer over a thin tunnel layer and into the floating gate 403 (e.g. for hot electron injection). This ion implantation for high-concentration doping to form the drain 407 can significantly multiplies the programming speed. Note that the access transistor 401 uses a smaller fraction of the applied drain pulse voltage, since the width of the access transistor 401 is typically within the range of 1.0 to 5.0 $\mu$m, compared with the 0.25 to 1.5 $\mu$m of the memory transistor 402.

Erasure of the memory cell 400 is achieved by applying 5 V to the source 408 of the memory transistor 402 while holding the control gate 404 at −7 V. A high electric field is generated in a tunnel oxide film 405 (shown in FIG. 4), thereby allowing the electrons collected in the floating gate 403 to overcome the potential energy barrier and tunnel (by Fowler-Nordheim tunneling, for example) through the tunnel oxide film 405 to the source 408 of the memory transistor 402. During the erasure, a voltage of 5 to 12 V is applied to the gate 401A and the drain 406 is left floating.

The source 408 of the memory transistor 402 also has high-concentration doping region 512. This high-concentration doping increases the dielectric breakdown of the junction, thereby significantly accelerating the transfer of electrons from the floating gate during the erasure. In this manner, the memory transistor 402 erases during the erasure operation to the point at which its threshold voltage is negative. Thus the memory transistor 402 cannot be turned off by the control gate 404. However, the access transistor 401 prevents this overerasure from affecting cell performance. More specifically, the access transistor 401 is not controlled by the state of the floating gate, so the threshold voltage of the access transistor 401 remains at approximately 0.7 V.

Various operating conditions can be set, other than those described above for programming and erasure operations. The conditions described below can also be set, for example, when programming and erasure are both provided by Fowler-Nordheim tunneling. Programming conditions can be: −8 V at the control gate, the source in floating, 8 V at the drain, and 8 V at the gate of the access transistor. Erasure conditions can be: 8 V at the control gate, −8 V at the source, the drain in floating, and 8 V at the gate of the access transistor.

A schematic view of a memory array 600 which comprises memory cells 400A to 400D is shown in FIG. 5. Each of these memory cells is identical to the memory cell 400. The drains 406 of the access transistors 401 of the cells 400A and 400B are coupled to a metal drain bit line 631, and the sources 408 of the memory transistors 402 of these cells 400A and 400B are coupled to a metal source bit line 630. The gates 401A of the access transistors 401 of the memory cells 400A and 400D are coupled to a word line 520, and the control gates 404 of the memory cells 400A and 400D are coupled to a control line 521.

Referring to FIG. 5, the reading of the memory cell 400A, for example, is accomplished by applying a standard voltage $V_{cc}$ (usually 5 V) to the gate 401A via the word line 520 as well as to the control gate 404 via the control line 521, while simultaneously sensing the read current flowing through the memory cell 400A by a conventional sense amplifier (not shown in the figure) that is connected to the drain bit line 631. If the memory cell 400A has been erased (i.e., if there is a zero charge or net positive charge on the floating gate 403), both the access transistor 401 and the memory transistor 402 are turned on, allowing a current to flow through the memory cell 400A which can be sensed by the sense amplifier. If the memory cell 400A is programmed (i.e., if there is a net negative charge on the floating gate 403), the threshold voltage of the memory transistor 402 rises above the supply voltage Vcc, preventing current from flowing through the memory cell 400A.

In this configuration, the sense amplifier which receives the voltage on the drain bit line generates a feedback voltage on the source bit line 630, which increases the voltage on the source bit line 630 during a read operation. This slows down the voltage drop on the drain bit line 631. Thus, the present invention significantly reduces the time required for the bit lines to recover their original state so that they can perform sensing during the next logic state cycle, in comparison with conventional memory cell arrays.

The main limitation to scaling of the memory transistor 402 is the punch-through requirement. Capacitive coupling between the drain 407 and the floating gate 403 typically causes the memory transistor 402 to be turned on by the coupling to the drain 407. This capacitive coupling limits the scalability of the channel length of the channel region 511 (see FIG. 4) and thus limits the improvement in programming speed that is necessary for the 5-V programming capability. More specifically, capacitive coupling from the drain 407 to the floating gate 403 degrades the punch-through margin of the memory transistor 402, and limits the capability of the memory transistor 402 to handle the drain voltage. The capacitive coupling effect does not scale with the gate line width of the memory transistor 402 because of the strong effect of fringing capacitance, which is the capacitance other than parallel-plate capacitance. Therefore, the effect of this drain coupling becomes more dominant for smaller geometries and poses a serious limitation to the scaling of conventional EEPROM and flash memories that do not have access gates. Note that the programming speed increases exponentially with the reciprocal of the effective channel length.

The memory cell of the present invention solves this scaling problem by the inclusion of the access transistor 401 within the memory cell 400. Since this memory cell eliminates punch-through of the memory transistor 402 in programming mode, the channel length of the channel region 511 can be scaled. This scalability means that the channel length can be reduced, which significantly increases the programming speed of the memory cell in comparison with the prior art. Moreover, the doping to the drain 407 enables the memory cell 400 to achieve a full 5-V programming capability.

(First Embodiment)

Figure 1:
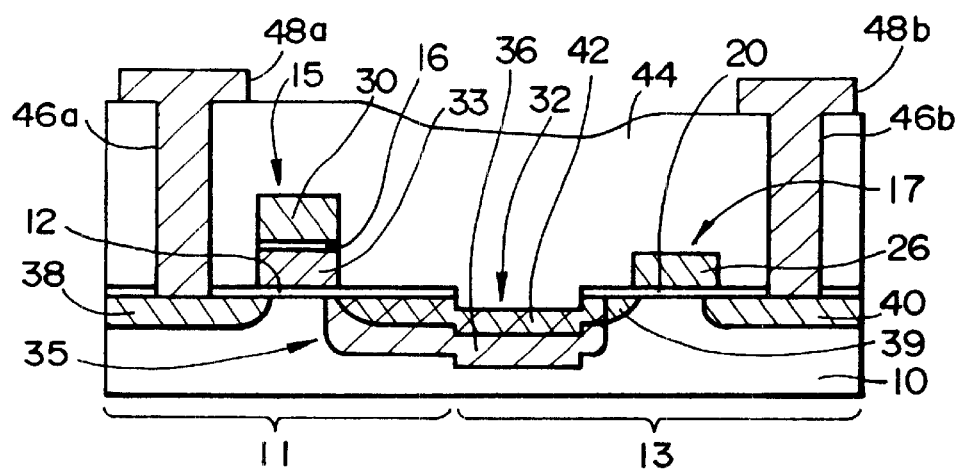
FIG. 1 is a cross-sectional view of a non-volatile semiconductor memory device manufactured by a first embodiment of the method of manufacturing a non-volatile semiconductor memory device of the present invention.

FIG. 1 is a cross-sectional view of a portion of a non-volatile semiconductor memory device manufactured by the first embodiment of the method of manufacturing a non-volatile semiconductor memory device of the present invention. The principal surface of a silicon substrate 10, which is an example of a semiconductor substrate, is divided into a first region 11 on which a memory cell 15 as a memory element is formed, and a second region 13 on which an access gate transistor 17 is formed. On the first region 11 is formed a silicon oxide layer 12 exemplifying the tunnel insulation layer, on which a floating gate 33, an ONO-layer 16 as a dielectric layer on the floating gate 33, and a control gate 30 on the ONO-layer 16 are formed. Within the first region 11, a source/drain 38 as a first source/drain and a source/drain 35 as a second source/drain are formed separately and in opposite positions across the control gate 30 and the floating gate 33.

On the second region 13 is formed a gate oxide layer 20 as a gate insulation layer, on which a gate electrode 26 is formed. Within the second region 13, a source/drain region 39 exemplifying the third source/drain region and a source/drain region 40 exemplifying the fourth source/drain region are formed separately and in opposite positions across the gate electrode 26.

In the silicon substrate 10 in the area between the floating gate 33 and the gate electrode 26, a groove section 32 is unavoidably formed. Over the area of the groove section 32, $N^+$ type regions 36 and 42 are formed in such a way that the $N^+$ type regions 36 and 42 overlap at the groove section 32, with the $N^+$ type region 36 being formed in a deeper position than the $N^+$ type region 42 in the silicon substrate 10. The $N^+$ type region 36 is an example of the first impurity region of the present invention, and the $N^+$ type region 42 is an example of the second impurity region. Part of the $N^+$ type regions 36 and 42 positioned in the first region 11 constitute the source/drain region 35, whereas part of the $N^+$ type region 42 positioned in the second region 13 constitutes the source/drain region 39. On the principal surface of the silicon substrate 10, a silicon oxide layer 44 is formed so that it covers the memory cell 15 and the access gate transistor 17. On the silicon oxide layer 44, a contact hole 46a is formed to expose the source/drain region 38, and a contact hole 46b is formed to expose the source/drain region 40. Over the silicon oxide layer 44, aluminum wiring layers 48a and 48b are provided. The aluminum wiring layer 48a is also formed within the contact hole 46a and is electrically connected with the source/drain region 38. Similarly, the aluminum wiring layer 48b is also formed within the contact hole 46b and is electrically connected to the source/drain region 40.

Figure 2:
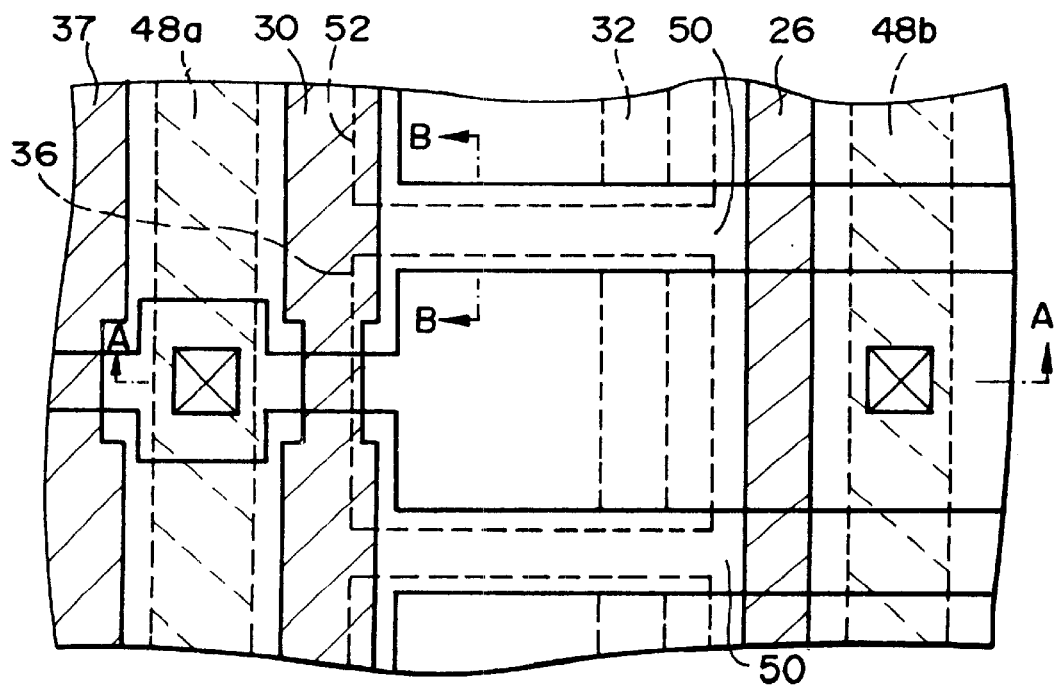
FIG. 2 is a partial plan view of a non-volatile semiconductor memory device manufactured by the first embodiment of the method of manufacturing a non-volatile semiconductor memory device of the present invention.

FIG. 2 is a plan view of the non-volatile semiconductor memory device shown in FIG. 5 at the segment indicated as 400A, and FIG. 1 is a cross-sectional view taken along the A—A line in the direction as indicated by the arrows corresponds to FIG. 1. The illustration shows that the control gate 37, aluminum wiring layer 48a, control gate 30, groove section 32, gate electrode 26, and the aluminum wiring layer 48b are formed with vertical spaces provided between them. The control gate 30 and the gate electrode 26 correspond respectively to the control gate 404 and the gate electrode 401A shown in FIG. 5.

Figure 6:
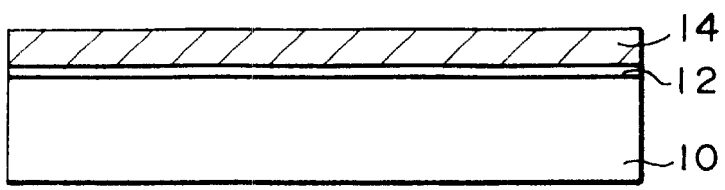
FIG. 6 is a partial cross-sectional view to illustrate the first step of the first embodiment of the method of manufacturing a non-volatile semiconductor memory device of the present invention.

The first embodiment of the non-volatile semiconductor memory device according to the present invention is described below. As shown in FIG. 6, a silicon oxide layer 12 as the tunnel insulation layer having a thickness of 7 to 10 nm is grown on the principal surface of the silicon substrate 10 by means of a thermal oxidation method, for example. A polysilicon layer 14 having a thickness of 100 to 200 nm, exemplifying the first conductive layer, is then grown over the silicon oxide layer 12 by means of a CVD method, for example.

Figure 7:
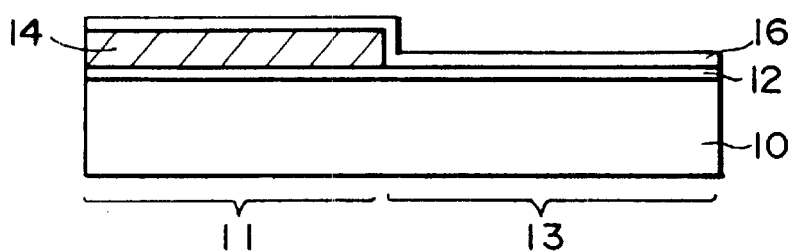
FIG. 7 is a partial cross-sectional view to illustrate the second step of the first embodiment of the method of manufacturing a non-volatile semiconductor memory device of the present invention.

As shown in FIG. 7, the polysilicon layer 14 over the area of a second region 13 is removed by a photo-etching technique, for example. Then an ONO-layer 16 is grown on the principal surface of the silicon substrate 10 to cover the polysilicon layer 14 on the first region 11. The oxide portions of the ONO layer 16 are formed for example, by a CVD method or a thermal oxidation method, and the nitride portion is formed, for example, by a CVD method.

Figure 8:
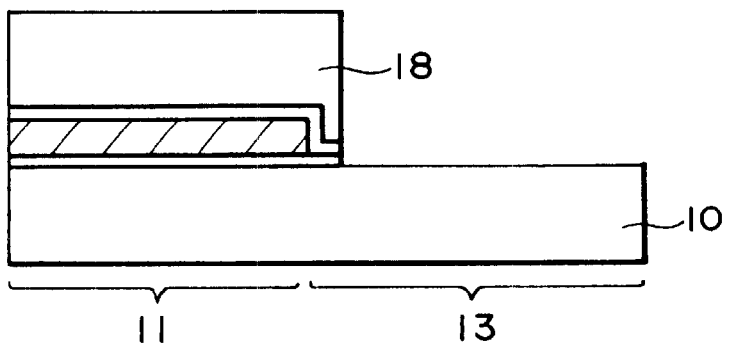
FIG. 8 is a partial cross-sectional view to illustrate the third step of the first embodiment of the method of manufacturing a non-volatile semiconductor memory device of the present invention.
Figure 9:
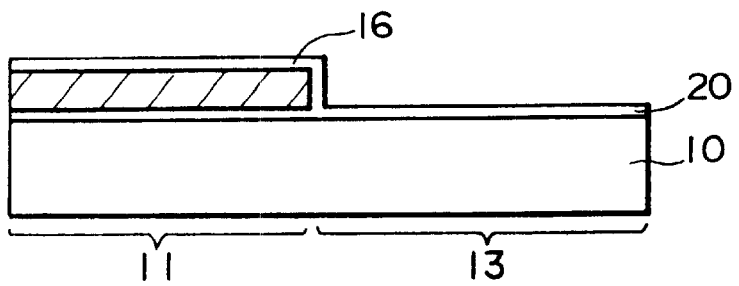
FIG. 9 is a partial cross-sectional view to illustrate the fourth step of the first embodiment of the method of manufacturing a non-volatile semiconductor memory device of the present invention.

As shown in FIG. 8, a resist 18 is formed on the principal surface of the silicon substrate 10. The resist 18 over the area of the second region 13 is then removed. By using the resist 18 as a mask, the ONO-layer 16 and silicon oxide layer 12 over the area of the second region 13 are etched to expose the principal surface of the silicon substrate 10. As shown in FIG. 9, a gate oxide layer 20 having a thickness of 5 to 20 nm is grown on the second region 13 by a thermal oxidation method, for example.

Figure 10:
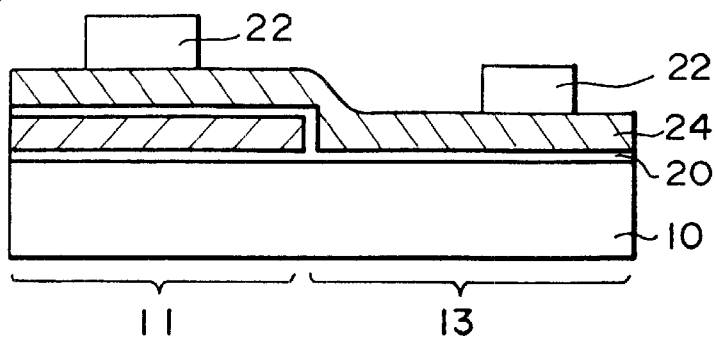
FIG. 10 is a partial cross-sectional view to illustrate the fifth step of the first embodiment of the method of manufacturing a non-volatile semiconductor memory device of the present invention.

As shown in FIG. 10, a polysilicon layer 24 having a thickness of 200 to 400 nm exemplifying the second conductive layer is grown over the entire principal surface of the silicon substrate 10 by means of a CVD method, for example. Note here that other examples of the second conductive layer include a laminated structure of a polysilicon layer having a thickness of 80 to 200 nm and a layer of silicide comprising $WSi_2$, $MoSi_2$, $CoSi_2$, $TiSi_2$ or other materials which is grown on the polysilicon layer to a thickness of 80 to 200 nm. Subsequently, a resist 22 is formed on the polysilicon layer 24 with a given patterning.

Figure 11:
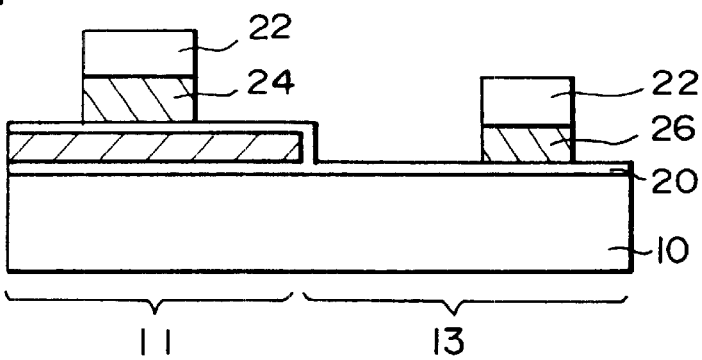
FIG. 11 is a partial cross-sectional view to illustrate the sixth step of the first embodiment of the method of manufacturing a non-volatile semiconductor memory device of the present invention.
Figure 12:
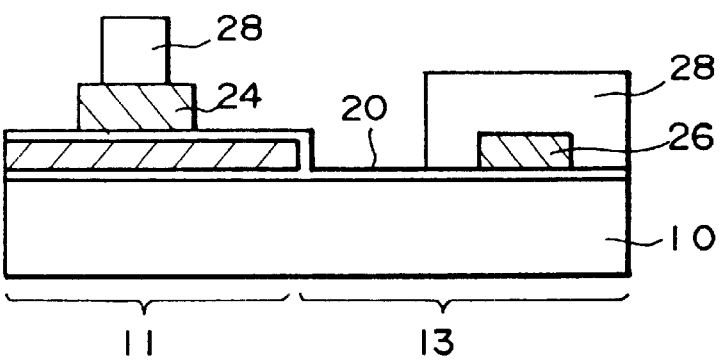
FIG. 12 is a partial cross-sectional view to illustrate the seventh step of the first embodiment of the method of manufacturing a non-volatile semiconductor memory device of the present invention.

As shown in FIG. 11, the polysilicon layer 24 is selectively etched by using as a mask the resist 22 which is the twelfth resist in the present invention, thereby leaving a portion of the polysilicon layer 24 on the first region 11 while forming a gate electrode 26 on the second region 13. Subsequently, a resist 28 is prepared over the entire principal surface of the silicon substrate 10, and then a pattern is provided on the resist 28 so that the resist 28 remains on the polysilicon layer 24 and also covers the gate electrode 26, as shown in FIG. 12. The resist 28 is the thirteenth resist in the present invention.

Figure 13:
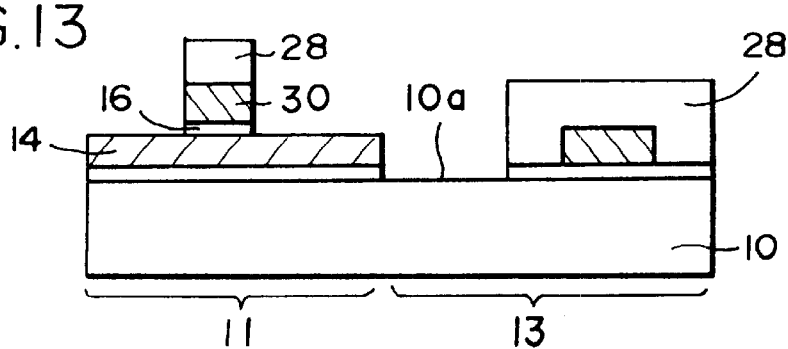
FIG. 13 is a partial cross-sectional view to illustrate the eighth step of the first embodiment of the method of manufacturing a non-volatile semiconductor memory device of the present invention.

As shown in FIG. 13, the polysilicon layer 24 is selectively etched first to form a control gate 30 using the resist 28 as a mask. Subsequently the ONO-layer 16 is selectively etched to leave the ONO-layer 16 positioned under the control gate 30. Concurrently with the selective etching of the ONO-layer 16 in the above, the silicon oxide layer 20 on the principal surface of the silicon substrate 10 is also removed at the position between the floating gate and the gate electrode to expose the principal surface 10a of the silicon substrate 10.

Figure 14:
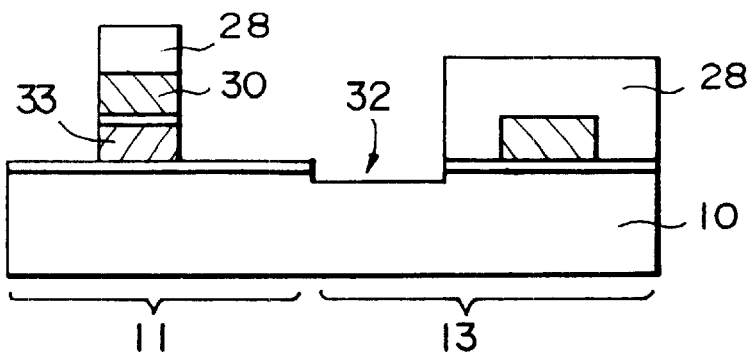
FIG. 14 is a partial cross-sectional view to illustrate the ninth step of the first embodiment of the method of manufacturing a non-volatile semiconductor memory device of the present invention.

A floating gate 33, as shown in FIG. 14, is then formed by selectively etching the polysilicon layer 14 using the resist 28 as a mask. Concurrently with the above etching, a portion of the silicon substrate 10 at the principal surface 10a is also removed to form a groove section 32 having a depth of 100 to 300 nm.

Figure 15:
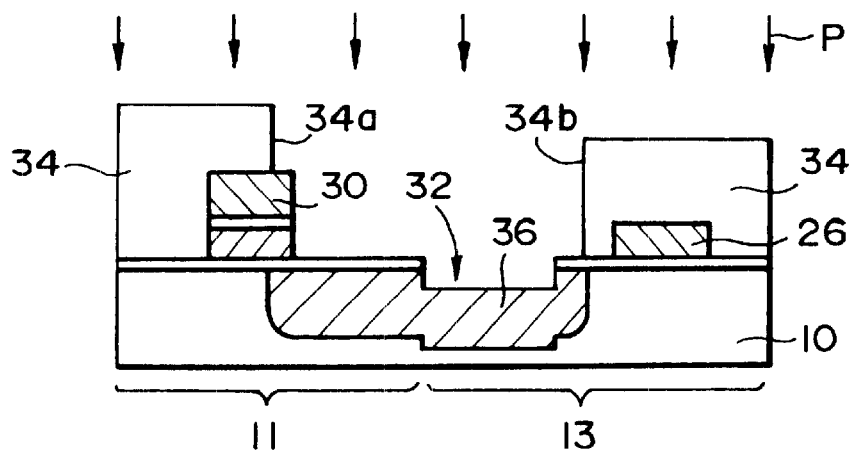
FIG. 15 is a partial cross-sectional view to illustrate the tenth step of the first embodiment of the method of manufacturing a non-volatile semiconductor memory device of the present invention.

Referring to FIG. 15, a resist 34 is formed over the entire principal surface of the silicon substrate 10. The resist 34 is then patterned to cover the first region 11 for forming the first source/drain region while its side surface 34a is positioned on the control gate 30 and, also cover the second region 13 for forming the fourth source/drain region while its side surface 34b is positioned between the gate electrode 26 and the groove section 32. The resist 34 thus prepared to cover the first region 11 for forming the first source/drain region with its side surface 34a being positioned on the control gate 30 corresponds to the first resist in the present invention. The resist 34 prepared to cover the second region 13 for forming the fourth source/drain region with its side surface 34b being positioned between the gate electrode 26 and the groove section 32 corresponds to the second resist in the present invention. By using the resist 34 as a mask, a phosphorus implantation is provided over an area covering the groove section 32 in the silicon substrate 10, under conditions of energy of 40 to 120 KeV and a dosage of $1E14/cm^2$ to $6E15/cm^2$. A phosphorus or arsenic implantation is then performed under conditions of 30 to 80 KeV and $1E15/cm^2$ to $6E15/cm^2$. These ion implantations represent an example of the first ion implantation in the present invention. After these ion implantations, a thermal treatment is provided on the implanted ions to form an N+ type region 36 exemplifying the first impurity region, having a thickness of 200 to 600 nm with an impurity concentration of $1E18/cm^3$ to $1E21/cm^3$. The thermal treatment for forming the first impurity region is performed under an $N_2$ or $N_2/O_2$ atmosphere for 30 to 180 minutes at 900 to 950° C. With the above-mentioned ion implantation and thermal treatment, the $N^+$ type region 36 is formed on the principal surface of the silicon substrate 10 so that it covers the groove section 32.

Figure 16:
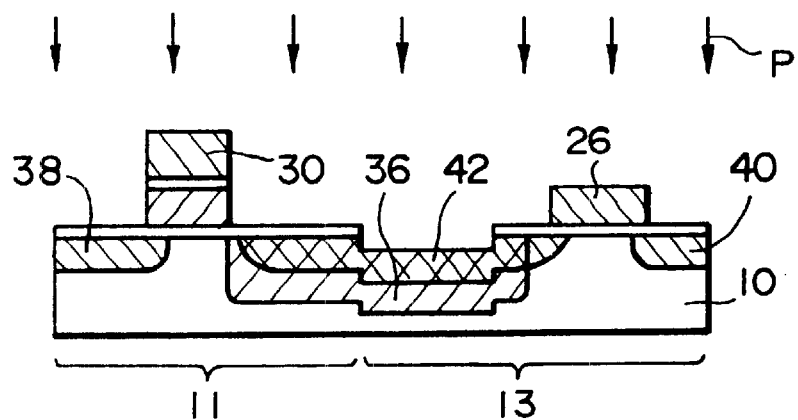
FIG. 16 is a partial cross-sectional view to illustrate the eleventh step of the first embodiment of the method of manufacturing a non-volatile semiconductor memory device of the present invention.

As shown in FIG. 16, a phosphorus implantation is then provided in the silicon substrate 10 by using the control gate 30 and gate electrode 26 as masks, under conditions of an energy of 40 to 120 KeV and a dosage of $5E12/cm^2$ to $5E14/cm^2$. A phosphorus or arsenic implantation is then performed under conditions of 30 to 80 KeV and $1E15/cm^2$ to $6E15/cm^2$. These ion implantations represent an example of the second ion implantation in the present invention. After the above ion implants and a thermal treatment, a source/drain region 38, $N^+$ type region 42, and a source/drain region 40 are formed. The $N^+$ type region 42 has a thickness of 100 to 400 nm with an impurity concentration of $1E17/cm^3$ to $1E21/cm^3$.

Referring to FIG. 1, a silicon oxide layer 44 as an interlayer insulation layer is formed over the entire principal surface of the silicon substrate 10 by a CVD method, for example. As the interlayer insulation layer, a PSG layer, an SOG layer, or a BPSG layer can be used in place of the silicon oxide layer. The interlayer insulation layer can also be a single layer of PSG, SOG, or BPSG, or of a multi-layered structure combining a silicon oxide layer, a PSG layer, a SOG layer, or a BPSG layer. Next, by using an appropriately patterned resist, the silicon oxide layer 44 is selectively etched to form a contact hole 46a to expose the source/drain region 38 as well as a contact hole 46b to expose the source/drain region 40. Subsequently, an aluminum layer is grown over the silicon oxide layer 44 by means of sputtering, for example, on which aluminum wiring layers 48a and 48b are formed by providing a patterning on the aluminum layer. Note that aluminum alloy wiring layer comprising aluminum and other metals such as copper can also be used in place of the aluminum wiring layer.

In the present embodiment, the impurity region comprising the $N^+$ type regions 36 and 42 in the groove section 32 are formed with the two ion implantations described with reference to FIGS. 15 and 16. Meanwhile, the source/drain regions 38, 39, and 40 are formed with the ion implantation described with reference to FIG. 16, under the conditions for thickness and impurity concentration required for forming these source/drain regions. Consequently, the present embodiment allows the formation of the source/drain regions 38, 39, and 40 with the thickness and impurity concentration necessary for these source/drain regions while lowering the diffusion resistance at the groove section 32. Moreover, since the side surface 34a of the resist 34 is not positioned between the control gate 30 and the groove section 32, this dispenses with the need to consider the mask alignment margin for the area between the control gate and the groove section, enabling shortening the distance between the control gate and the groove section, thereby achieving a high concentration and a high degree of integration for the non-volatile semiconductor memory device.

(Second Embodiment)

Figure 17:
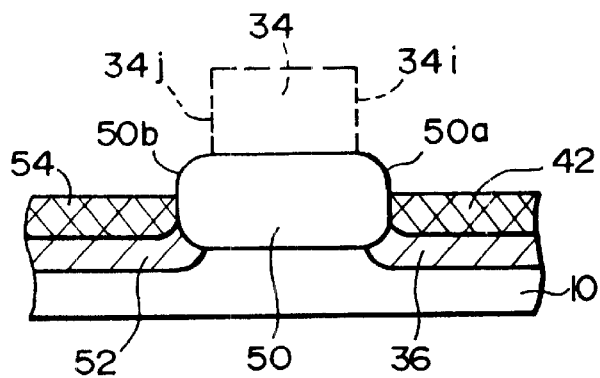
FIG. 17 is a partial cross-sectional view of the B—B plane of FIG. 2, viewed in the direction indicated by the arrows.

FIG. 17 is a partial cross-sectional view of FIG. 2 at the B_B line, viewed in the direction indicated by the arrows. Referring to FIGS. 2 and 17, N⁺ type regions 36 and 52 are separated by a field oxide layer 50, which is an example of the element-isolating insulation layer in the present invention. The N⁺ type regions 36 and 52 have been formed by the ion implantation described in reference to FIG. 15. Meanwhile, an N⁺ type region 42 is formed on the N⁺ type region 36, and an N⁺ type region 54 is formed on the N⁺ type region 52. The N⁺ type regions 42 and 54 have been formed by the ion implantation described with reference to FIG. 16. The N⁺ type regions 36 and 52 are formed by an ion implantation into the silicon substrate 10 using the resist 34 formed on the field oxide layer 50 as a mask. An side surface 34i of the resist 34 is positioned inside a side surface 50a of the field oxide layer 50, and the other side surface 34j of the resist 34 is positioned inside the other side surface 50b of the field oxide layer 50. As a result, the N⁺ type region 36 is formed to extend around the field oxide layer 50 and beyond the side surface 50a, and the N⁺ type region 52 is similarly formed to extend beyond the other side surface 50b. Consequently, the distance between the N⁺ type region 36 and the N⁺ type region 52 is made shorter than desired, presenting the possibility of a punch-through. The second embodiment of the present invention described hereunder is intended to prevent the above-mentioned problem.

Figure 18:
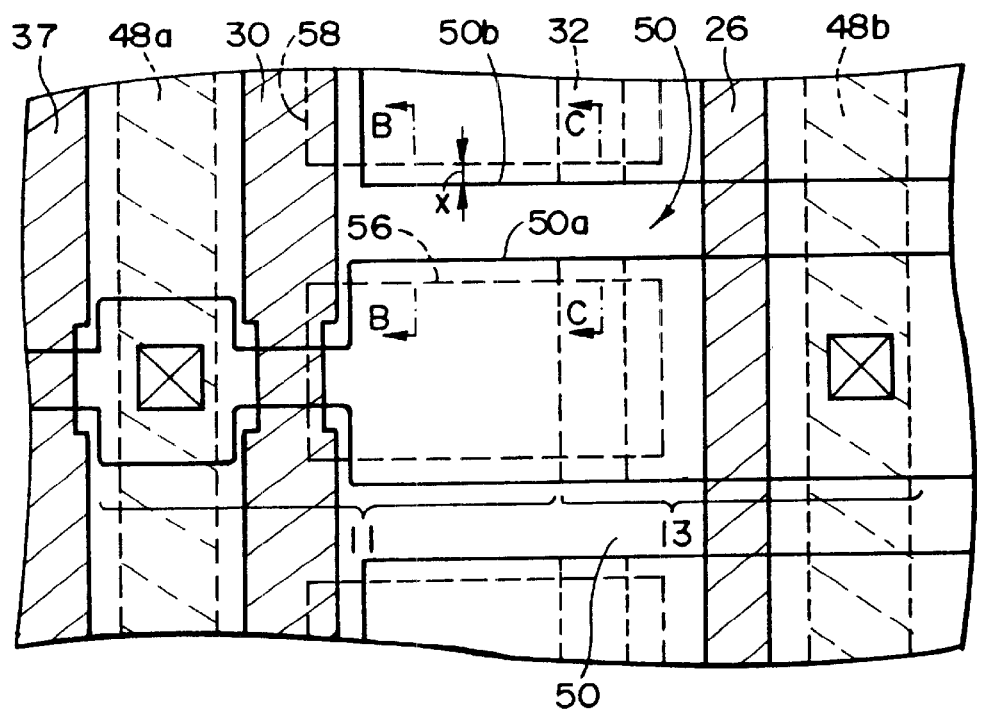
FIG. 18 is a partial plan view of a non-volatile semiconductor memory device manufactured by a second embodiment of the method of manufacturing a non-volatile semiconductor memory device of the present invention.
Figure 19:
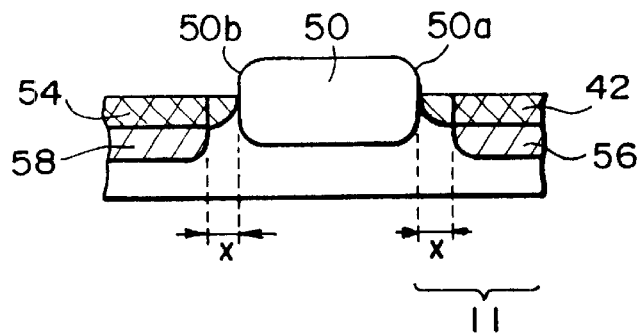
FIG. 19 is a partial cross-sectional view of the B—B plane of FIG. 18, viewed in the direction indicated by the arrows.

FIG. 18 is a partial plan view of a non-volatile semiconductor memory device manufactured by the second embodiment of the method of manufacturing a non-volatile semiconductor memory device according to the present invention. FIG. 19 is a partial cross-sectional view of the B—B plane of FIG. 18, viewed in the direction indicated by the arrows. Of the above referenced figures, components that are equivalent to those in the configuration illustrated in FIG. 2 and FIG. 17 are shown with identical symbols and further description is omitted. As shown in FIG. 19, the N⁺ type region 56 exemplifying the first impurity region does not extend to underneath one side surface 50a of the field oxide layer 50, leaving a certain distance x between the N⁺ type region 56 and the side surface 50a. The distance x, for example, is 0.1 μm or more but not more than 0.3 μm. Similarly, the distance between the N⁺ type region 58 and the other side surface 50b of the field oxide layer 50 is also x. As described above, in the non-volatile semiconductor memory device manufactured according to the second embodiment of the present invention, the distance between the N⁺ type region 56 and the N⁺ type region 58 can be made greater than that of the example shown in FIG. 17, thereby preventing a punch-through. It is preferable to apply the present invention when the width of the field oxide layer is 2 to 3 μm or less.

Figure 20A:
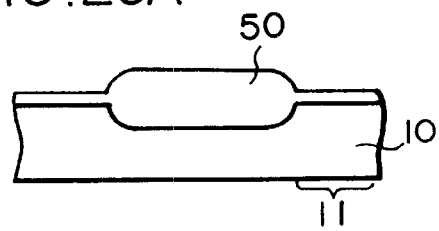
FIG. 20A is a partial cross-sectional view to illustrate the first step of the second embodiment of the method of manufacturing a non-volatile semiconductor memory device of the present invention.
Figure 20B:
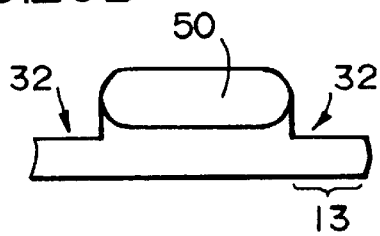
FIG. 20B is a partial cross-sectional view to illustrate the first step of the second embodiment of the method of manufacturing a non-volatile semiconductor memory device of the present invention.

A method of manufacturing the configuration shown in FIG. 19 is described below. FIGS. 20A through 22A are cross-sectional views of the B—B plane of FIG. 18, viewed in the direction indicated by the arrows. FIGS. 20B through 22B are cross-sectional views of the C—C plane of FIG. 18, viewed in the direction indicated by the arrows. Referring to FIG. 20A and FIG. 20B, the groove section 32 is formed on the silicon substrate 10 when the floating gate is formed.

Figure 21A:
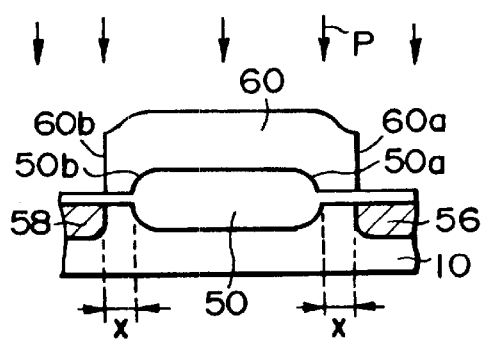
FIG. 21A is a partial cross-sectional view to illustrate the second step of the second embodiment of the method of manufacturing a non-volatile semiconductor memory device of the present invention.
Figure 21B:
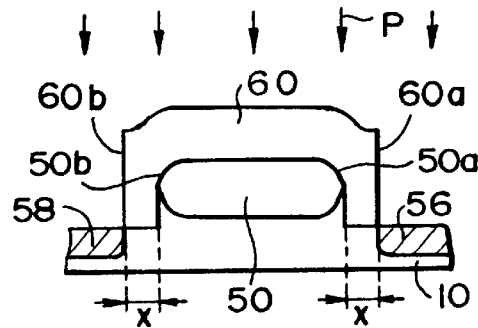
FIG. 21B is a partial cross-sectional view to illustrate the second step of the second embodiment of the method of manufacturing a non-volatile semiconductor memory device of the present invention.

Referring to FIGS. 21A and 21B, the manufacturing steps illustrated in these figures are identical to those described in FIG. 15. However, one side surface 60a of the resist 60 exemplifying the eleventh resist of the present invention is positioned outside a side portion 50a of the field oxide layer 50, while the other side surface 60b is positioned outside the other side portion 50b. The distance between respective side surfaces and side portions is x (i.e. 0.1 to 0.3 μm). Subsequently, the first ion implantation is provided on the silicon substrate 10 using the resist 60 as a mask, followed by a thermal treatment to form the N⁺ type regions 56 and 58. The conditions for the ion implantation and the thermal treatment are the same as in the first embodiment.

Figure 22A:
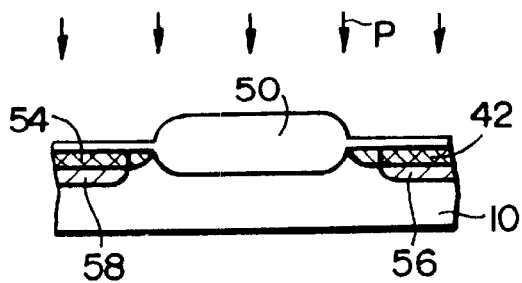
FIG. 22A is a partial cross-sectional view to illustrate the third step of the second embodiment of the method of manufacturing a non-volatile semiconductor memory device of the present invention.
Figure 22B:
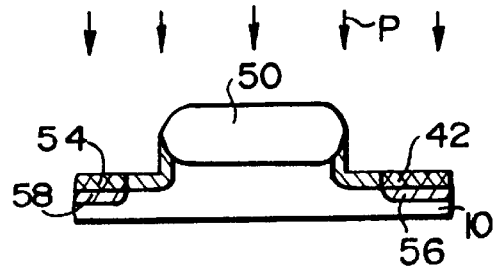
FIG. 22B is a partial cross-sectional view to illustrate the third step of the second embodiment of the method of manufacturing a non-volatile semiconductor memory device of the present invention.

Referring to FIGS. 22A and 22B, the manufacturing steps illustrated in these figures are identical to those described in FIG. 16. The second ion implantation is provided on the silicon substrate 10 using the field oxide layer 50 as a mask, followed by a thermal treatment to form the N⁺ type regions 42 and 54. The conditions for the above ion implantation are the same as in the first embodiment.

(Third Embodiment)

Figure 23:
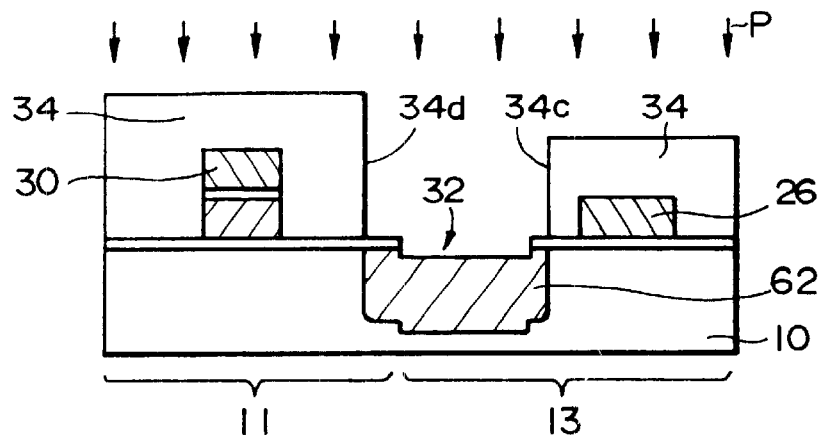
FIG. 23 is a partial cross-sectional view to illustrate the first step of a third embodiment of the method of manufacturing a non-volatile semiconductor memory device of the present invention.

The difference between the third embodiment and the first embodiment is the positioning of the side surfaces 34a and 34b of the resist 34 shown in FIG. 15. The third embodiment is described below with reference to FIG. 23 and FIG. 24. After completing the manufacturing steps shown in FIG. 14 in the same manner as in the first embodiment, a resist 34 is formed over the principal surface of the silicon substrate 10, as shown in FIG. 23. The resist 34 is patterned so that it covers the first region 11 for forming the first source/drain region while its side surface 34d is positioned between the control gate 30 and the groove section 32 and, at the same time, it also covers the second region 13 for forming the fourth source/drain region while its side surface 34c is positioned between the gate electrode 26 and the groove section 32. The resist 34 thus provided to cover the first region 11 for forming the first source/drain region with its side surface 34d being positioned between the control gate 30 and the groove section 32 corresponds to the third resist in the present invention. The resist 34 provided to cover the second region 13 for forming the fourth source/drain region with its side surface 34c being positioned between the gate electrode 26 and the groove section 32 corresponds to the fourth resist in the present invention. Using the resist 34 as a mask, the first ion implantation is performed, followed by a thermal treatment to form an N+ type region 62 exemplifying the first impurity region of the present invention. The conditions for the above ion implantation and the thermal treatment are the same as in the first embodiment.

Figure 24:
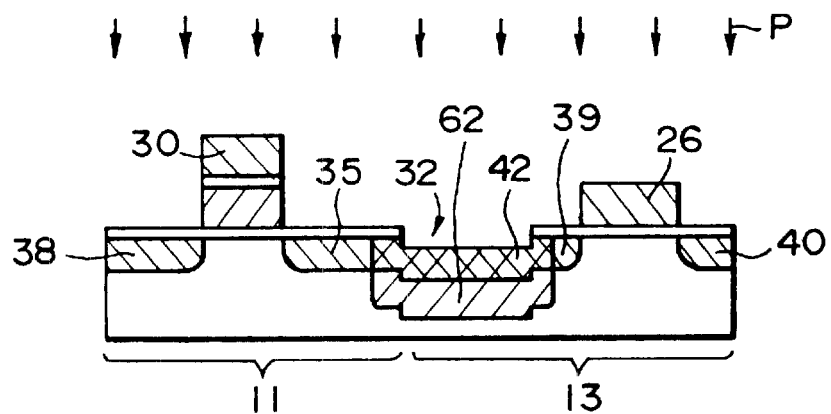
FIG. 24 is a partial cross-sectional view to illustrate the second step of the third embodiment of the method of manufacturing a non-volatile semiconductor memory device of the present invention.

Next, referring to FIG. 24, a second ion implantation is performed in the silicon substrate 10 using the control gate 30 and the gate electrode 26 as masks, under the same conditions as in the first embodiment. A subsequent thermal treatment forms a source/drain region 38, an N⁺ type region 42, and a source/drain region 40. The conditions for the ion implantation as well as the following the manufacturing steps are the same as in the first embodiment.

In the present embodiment, the impurity region comprising the N⁺ type regions 62 and 42 of the groove section are formed with the two ion implantations described with reference to FIGS. 23 and 24. Meanwhile, the source/drain regions 38, 35, 39, and 40 are formed with the ion implantation described with reference to FIG. 24, under the conditions for depth and concentration of impurities required for forming these source/drain regions. Consequently, the present embodiment allows the formation of the source/drain regions 38, 35, 39, and 40 with the depth and concentration of impurities necessary for these source/drain regions while lowering the diffusion resistance in the impurity region at the groove section 32.

(Fourth Embodiment)

Figure 25:
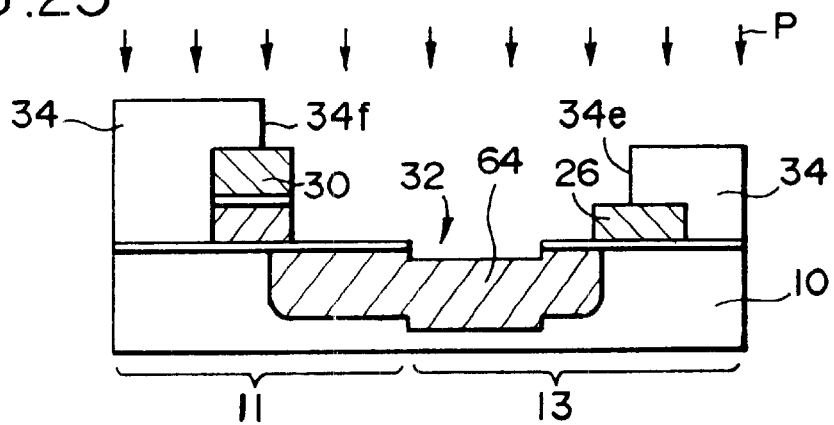
FIG. 25 is a partial cross-sectional view to illustrate the first step of a fourth embodiment of the method of manufacturing a non-volatile semiconductor memory device of the present invention.

The difference between the fourth embodiment and the first or third embodiments is the positioning of the side surfaces 34a through 34d of the resist 34 shown in FIGS. 15 and 23. The fourth embodiment is described below with reference to FIGS. 25 and 26. After completing the manufacturing steps shown in FIG. 14 in the same manner as in the first embodiment, a resist 34 is formed over the entire principal surface of the silicon substrate 10, as shown in FIG. 25. The resist 34 is patterned so that it covers the first region 11 for forming the first source/drain region while its side surface 34f is positioned on the control gate 30 and also cover the second region 13 for forming the fourth source/drain region while its side surface 34e is positioned on the gate electrode 26. The resist 34 thus provided to cover the first region 11 for forming the first source/drain region with its side surface 34f being positioned on the control gate 30 corresponds to the fifth resist in the present invention. The resist 34 prepared to cover the second region 13 for forming the fourth source/drain region with its side surface 34e being positioned on the gate electrode 26 corresponds to the sixth resist in the present invention. Using the resist 34 as a mask, the first ion implantation operation is performed on the silicon substrate 10 followed by a thermal treatment to form an N+ type region 64 exemplifying the first impurity region of the present invention. The conditions for these ion implantation operations and the thermal treatment are the same as in the first embodiment.

Figure 26:
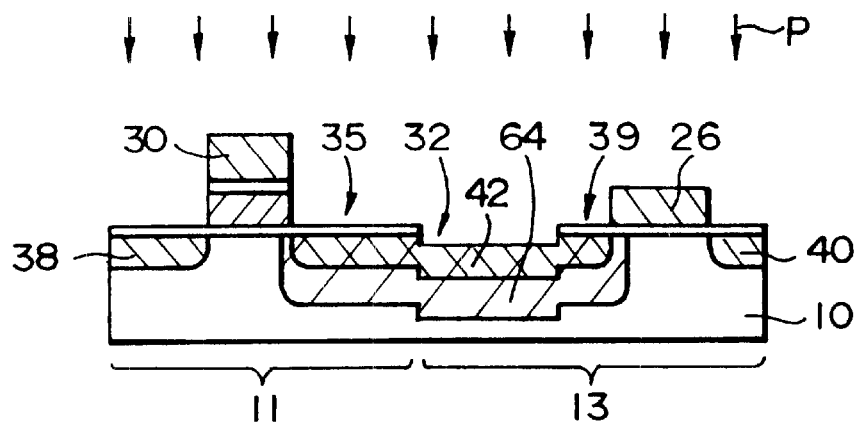
FIG. 26 is a partial cross-sectional view to illustrate the second step of the fourth embodiment of the method of manufacturing a non-volatile semiconductor memory device of the present invention.

Next, referring to FIG. 26, the second ion implantation operation is performed in the silicon substrate 10 using the control gate 30 and the gate electrode 26 as masks. A subsequent thermal treatment forms a source/drain region 38, an N+ type region 42, and a source/drain region 40. The conditions for the ion implantation as well as the rest of the manufacturing steps are the same as in the first embodiment. In the fourth embodiment, the N+ type regions 42 and 64 located in the first region 11 constitute the source/drain region 35, whereas the N+ type regions 42 and 64 located in the second region 13 constitute the source/drain region 39.

In the present embodiment, the N+ type regions 42 and 64 at the groove section 32 are formed with the two ion implantation operations described in reference to FIGS. 25 and 26. Meanwhile, the source/drain regions 38 and 40 are formed with the ion implantation described with reference to FIG. 26, under the conditions for depth and concentration of impurities required for forming these source/drain regions 38 and 40. Consequently, the present embodiment allows the formation of the source/drain regions 38 and 40 with the depth and concentration of impurities necessary for these source/drain regions while lowering the diffusion resistance at the groove section 32. Moreover, since the side surface 34f of the resist 34 is not positioned between the control gate 30 and the groove section 32, this dispenses with the need to consider the mask alignment margin between the control gate and the groove section, which enables shortening the distance between them. Furthermore, since the side surface 34e of the resist 34 is not positioned between the gate electrode 26 and the groove section 32, there is no need to allow for the mask alignment margin, which enables shortening the distance between the gate electrode and the groove section. Consequently, the present embodiment enables achieving a higher cell density and a higher degree of integration for the non-volatile semiconductor memory device than in the first embodiment of the method of manufacturing a non-volatile semiconductor memory device according to the present invention.

(Fifth Embodiment)

The difference between the fifth embodiment and the first, third, or fourth embodiments is the positioning of the side surfaces 34a through 34f of the resist 34 shown in FIG. 15, FIG. 23, and FIG. 25. The fifth embodiment is described hereunder with reference to FIG. 27 and FIG. 28.

Figure 27:
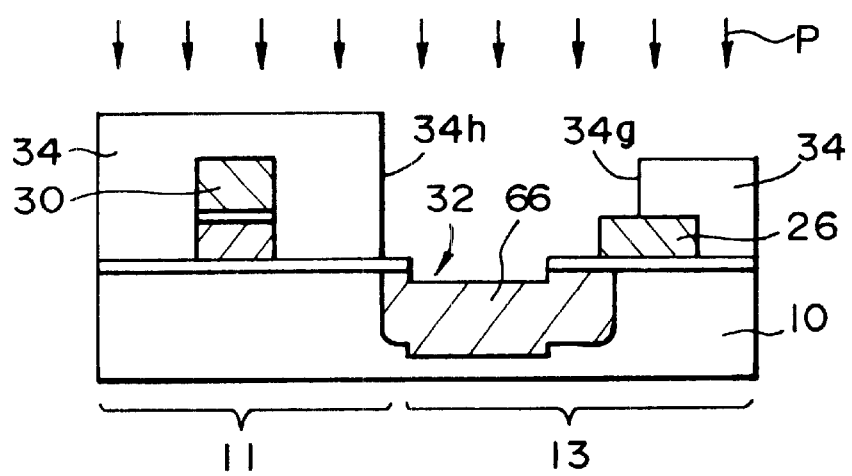
FIG. 27 is a partial cross-sectional view to illustrate the first step of a fifth embodiment of the method of manufacturing a non-volatile semiconductor memory device of the present invention.

After completing the manufacturing steps shown in FIG. 14 in the same manner as in the first embodiment, a resist 34 is formed on the principal surface of the silicon substrate 10, as shown in FIG. 27. The resist 34 is patterned to cover the first region 11 for forming the first source/drain region while its side surface 34h is positioned between the control gate 30 and the groove section 32 and also cover the second region 13 for forming the fourth source/drain region while its side surface 34g is positioned on the gate electrode 26. The resist 34 thus provided to cover the first region 11 for forming the first source/drain region with its side surface 34h being positioned between the control gate 30 and the groove section 32 corresponds to the seventh resist in the present invention. The resist 34 provided to cover the second region 13 for forming the fourth source/drain region with its side surface 34g being positioned on the gate electrode 26 corresponds to the eighth resist in the present invention. Using the resist 34 as a mask, the first implantation is performed to the silicon substrate 10 followed by a thermal treatment to form an N+ type region 66 exemplifying the first impurity region of the present invention. The conditions for the above ion implantation and the thermal treatment are the same as in the first embodiment.

Figure 28:
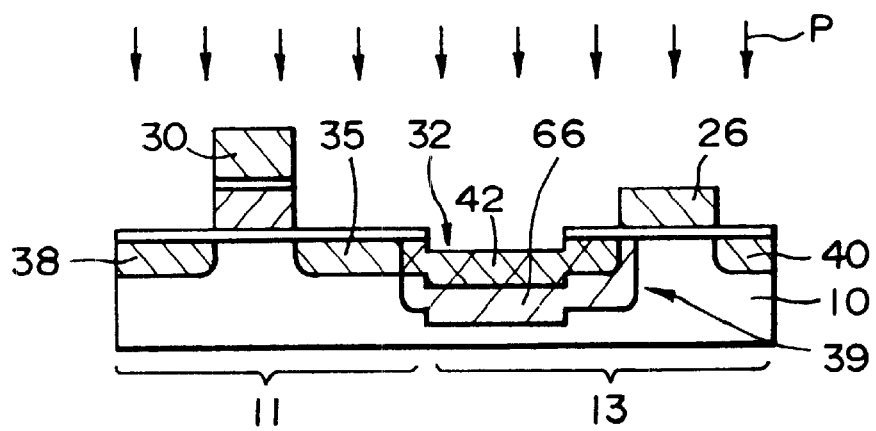
FIG. 28 is a partial cross-sectional view to illustrate the second step of the fifth embodiment of the method of manufacturing a non-volatile semiconductor memory device of the present invention.

Next, referring to FIG. 28, the second ion implantation is performed on the silicon substrate 10 using the gate electrode 26 and the control gate 30 as masks. After a subsequent thermal treatment, a source/drain region 38, an N+ type region 42, and a source/drain region 40 are formed. The conditions for the ion implantation as well as the rest of the manufacturing steps are the same as in the first embodiment. In the fifth embodiment, the N+ type region 42 located in the first region 11 constitutes the source/drain region 35, whereas the N+ type regions 42 and 66 located in the second region 13 constitute the source/drain region 39. The impurity region comprising the N+ type regions 42 and 66 at the groove section 32 is formed with the two ion implantations described with reference to FIGS. 27 and 28. Meanwhile, the source/drain regions 38, 35, and 40 are formed with the ion implantation described with reference to FIG. 28. This ion implantation is performed under the conditions for depth and concentration of impurities required for forming these source/drain regions. Consequently, the present embodiment allows the formation of the source/drain regions 38, 35, and 40 with the depth and concentration of impurities necessary for these source/drain regions while lowering the diffusion resistance at the groove section 32. Moreover, since the side surface 34g of the resist 34 is not positioned between the gate electrode 26 and the groove section 32, it dispenses with the need to consider for the mask alignment margin between the gate electrode and the groove section, which enables shortening the distance between them. As a result a higher cell density and a higher degree of integration for the non-volatile semiconductor memory device could be achieved.

(Sixth Embodiment)

Figure 29:
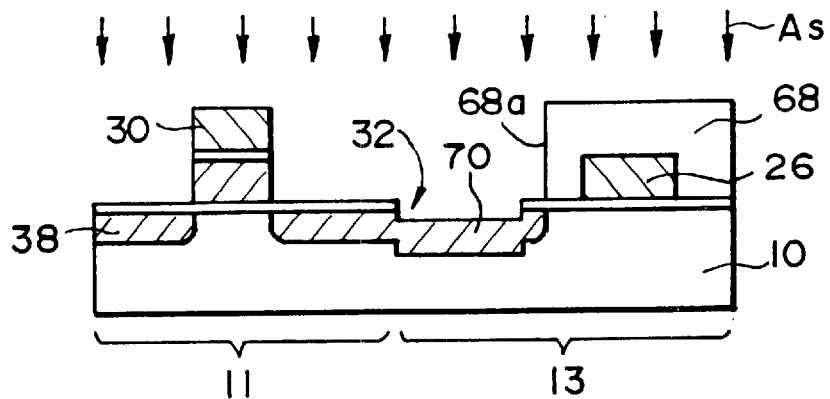
FIG. 29 is a partial cross-sectional view to illustrate the first step of a sixth embodiment of the method of manufacturing a non-volatile semiconductor memory device of the present invention.

The difference between the sixth embodiment and the first, as well as the third through fifth embodiments is the positioning of the side surfaces 34a through 34h of the resist 34 shown in FIG. 15, FIG. 23, FIG. 25, and FIG. 27. The sixth embodiment is described below with reference to FIG. 29 and FIG. 30. After completing the manufacturing steps shown in FIG. 14 in the same manner as in the first embodiment, a resist 68 is formed on the silicon substrate 10, as shown in FIG. 29. The resist 68 is patterned to cover the second region 13 for forming the fourth source/drain region, while its side surface 68a is positioned between the gate electrode 26 and the groove section 32. The resulting patterned resist corresponds to the ninth resist in the present invention. Using the control gate 30 and the resist 68 as masks, an arsenic implantation is performed in the principal surface of the silicon substrate 10, followed by a thermal treatment to form a source/drain region 38 and an N$^+$ type region 70 exemplifying the first impurity region of the present invention. Note here that phosphorus can be implanted in place of arsenic, or a combination of phosphorus and arsenic can be used in this step. The conditions for the above ion implantation and the thermal treatment are the same as in the first embodiment.

Figure 30:
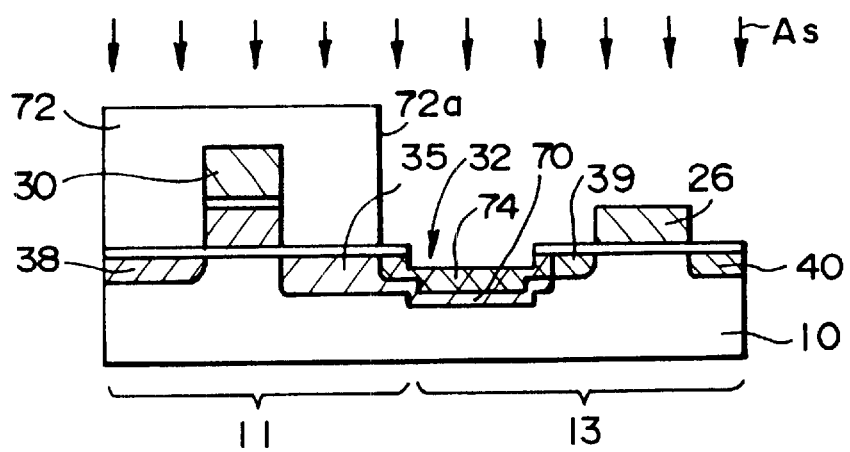
FIG. 30 is a partial cross-sectional view to illustrate the second step of the sixth embodiment of the method of manufacturing a non-volatile semiconductor memory device of the present invention.

Subsequently, a resist 72 is formed on the silicon substrate 10, as shown in FIG. 30. The resist 72 is patterned to cover the first region 11 for forming the first source/drain region, while its side surface 72a is positioned between the control gate 30 and the groove section 32. The resulting patterned resist 72 corresponds to the tenth resist in the present invention. Using the resist 72 and the gate electrode 26 as masks, arsenic is implanted into the principal surface of the silicon substrate 10, followed by a thermal treatment to form a source/drain region 40 and an N$^+$ type region 74 exemplifying the second impurity region of the present invention. The conditions for the above ion implantation as well as the rest of the manufacturing steps are the same as in the first embodiment.

In the sixth embodiment, the N$^+$ type region 70 located in the first region 11 constitutes the source/drain region 35, whereas the N$^+$ type region 74 located in the second region 13 constitutes the source/drain region 39. The impurity region comprising the N$^+$ type regions 70 and 74 at the groove section 32 is formed with the two ion implantations described with reference to FIGS. 29 and 30. Meanwhile, the source/drain regions 38, 35, 39, and 40 are formed with the ion implantation described with reference to FIG. 30. This ion implantation is performed under the conditions for depth and concentration of impurities required for forming these source/drain regions. Consequently, the present embodiment allows the formation of the source/drain regions 38, 35, 39, and 40 with the depth and concentration of impurities necessary for these source/drain regions while lowering the diffusion resistance at the groove section 32.

(Seventh Embodiment)

Figure 31:
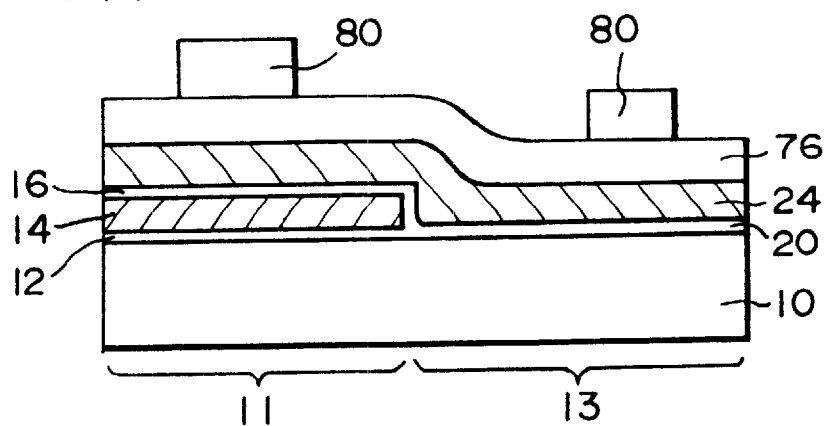
FIG. 31 is a partial cross-sectional view to illustrate the first step of a seventh embodiment of the method of manufacturing a non-volatile semiconductor memory device of the present invention.

The seventh embodiment of the present invention is described below. Referring to FIG. 31, the manufacturing steps up to the formation of the polysilicon layer 24 are the same as in the first embodiment, for which further explanations are omitted. On the polysilicon layer 24, a silicon oxide layer 76 having a thickness of 200 to 300 nm is grown by means of a CVD method, for example. This silicon oxide layer 76 exemplifies the first insulation layer in the present invention. Next, on the silicon oxide layer 76, a resist 80 as the fourteenth resist in the present invention is formed and provided with a pattern for a control gate and a gate electrode.

Figure 32:
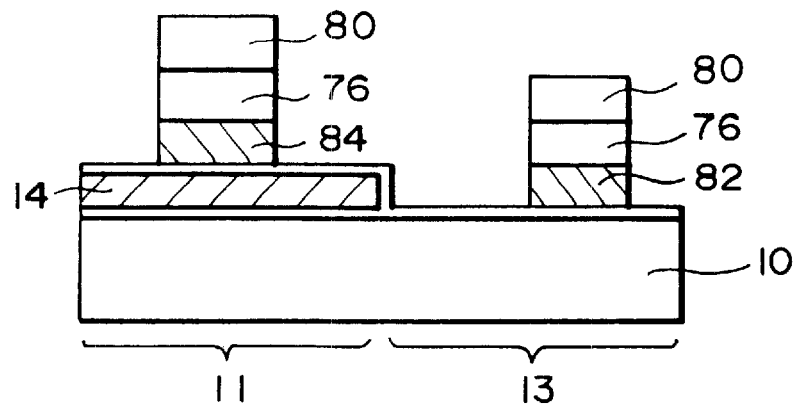
FIG. 32 is a partial cross-sectional view to illustrate the second step of the seventh embodiment of the method of manufacturing a non-volatile semiconductor memory device of the present invention.

Referring to FIG. 32, using the resist 80 as a mask, the silicon oxide layer 76 and the polysilicon layer 24 are selectively etched in succession to simultaneously form a control gate 84 and a gate electrode 82.

Figure 33:
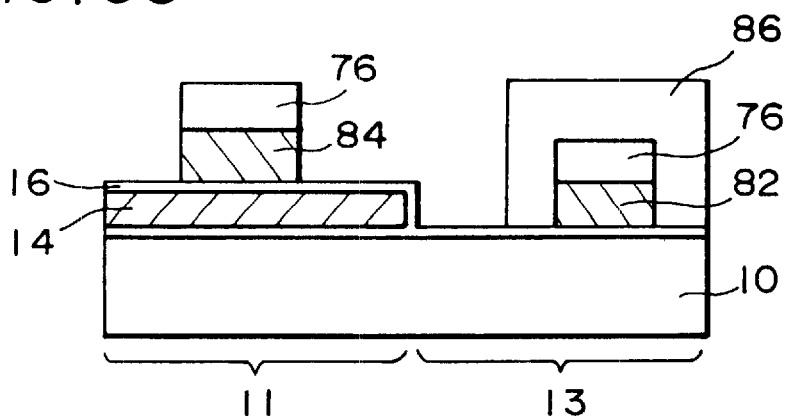
FIG. 33 is a partial cross-sectional view to illustrate the third step of the seventh embodiment of the method of manufacturing a non-volatile semiconductor memory device of the present invention.

As shown in FIG. 33, on the principal surface of the silicon substrate 10, a resist 86 is formed and provided with a pattern to cover the gate electrode 82. The above resist 86 corresponds to the fifteenth resist in the present invention.

Figure 34:
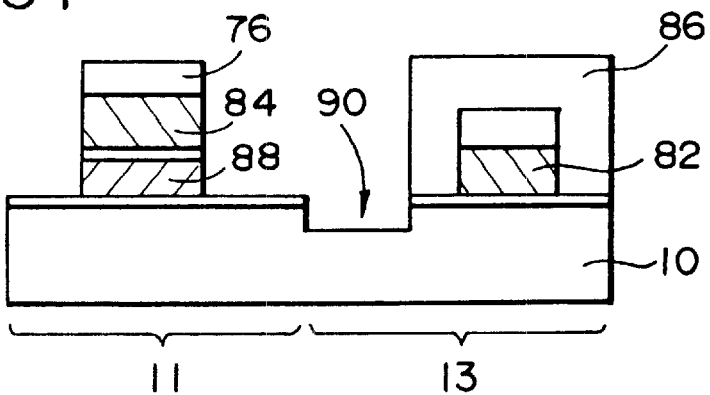
FIG. 34 is a partial cross-sectional view to illustrate the fourth step of the seventh embodiment of the method of manufacturing a non-volatile semiconductor memory device of the present invention.

Referring to FIG. 34, using the resist 86 and the silicon oxide layer 76 on the control gate 84 as masks, the ONO-layer 16 and the polysilicon layer 14 are selectively etched in succession to form a floating gate 88. In the step of forming the floating gate 88, a groove section 90 is formed in the silicon substrate 10 in the area between the floating gate 88 and the gate electrode 82, in the same unavoidable manner as described in the first embodiment.

Figure 35:
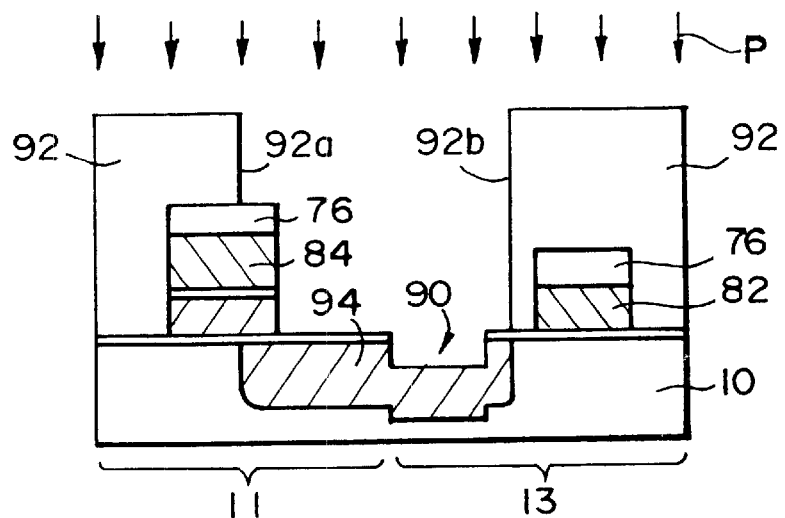
FIG. 35 is a partial cross-sectional view to illustrate the fifth step of the seventh embodiment of the method of manufacturing a non-volatile semiconductor memory device of the present invention.

Referring to FIG. 35, a resist 92 is formed on the principal surface of the silicon substrate 10. The resist 92 is patterned to cover the first region 11 for forming the first source/drain region while its side surface 92a is positioned on the control gate 84 and also cover the second region 13 for forming the fourth source/drain region while its side surface 92b is positioned between the gate electrode 82 and the groove section 90. The resist 92 thus provided to cover the first region 11 for forming the first source/drain region with its side surface 92a being positioned on the control gate 84 corresponds to the first resist in the present invention. Meanwhile, the resist 92 provided to cover the second region 13 for forming the fourth source/drain region with its side surface 92b being positioned between the gate electrode 82 and the groove section 90 corresponds to the second resist in the present invention. Using the resist 92 as a mask, the first ion implantation is performed on the silicon substrate 10, followed by a thermal treatment to form an N$^+$ type region 94 covering the groove section 90 and exemplifying the first impurity region of the present invention. The conditions for the above ion implantation and the thermal treatment are the same as in the first embodiment.

Figure 36:
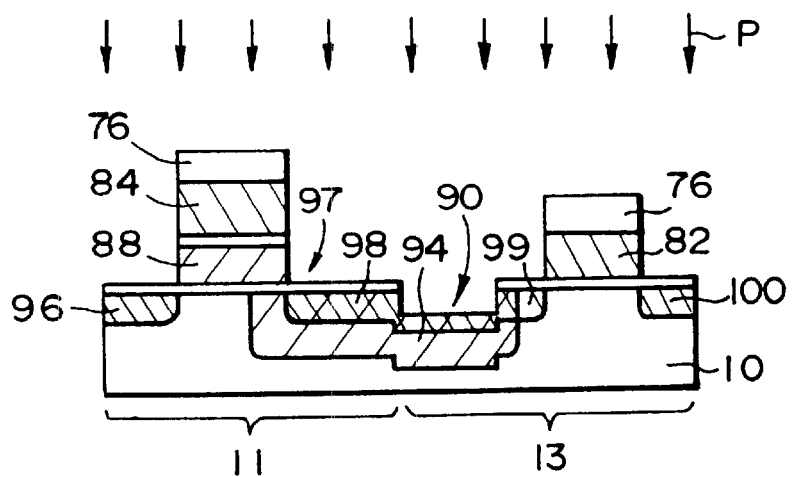
FIG. 36 is a partial cross-sectional view to illustrate the sixth step of the seventh embodiment of the method of manufacturing a non-volatile semiconductor memory device of the present invention.

Next, referring to FIG. 36, the second ion implantation is performed on the silicon substrate 10 using as masks the silicon oxide layer 76 on the control gate 84 and also the silicon oxide layer 76 on the gate electrode 82. A subsequent thermal treatment forms a source/drain region 96 exemplifying the first source/drain region of the present invention, an N$^+$ type region 98 exemplifying the second impurity region, and a source/drain region 100 exemplifying the fourth source/drain region. The conditions for the ion implantation are the same as in the first embodiment. The N$^+$ type regions 94 and 98 located in the first region 11 constitute the source/drain region 97 exemplifying the second source/drain region of the present invention. The N$^+$ type regions 98 located in the second region 13 constitutes the source/drain region 99 exemplifying the third source/drain region.

The rest of the manufacturing steps are the same as in the first embodiment. In this seventh embodiment, as shown in FIG. 32, since the control gate 84 and the gate electrode 82 are simultaneously formed, there is no need to consider the margin for aligning the masks for forming the control gate 84 and the gate electrode 82. Consequently, the distance between the control gate 84 and the gate electrode 82 can be reduced to contribute to microminiaturization of the non-volatile semiconductor memory device.

(Eighth Embodiment)

Figure 37:
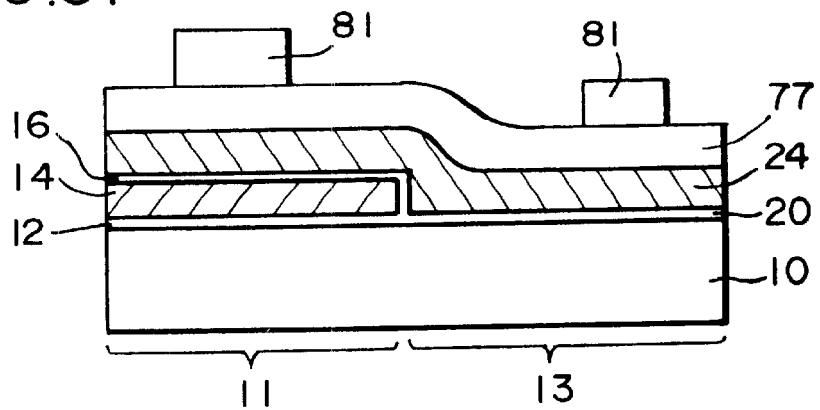
FIG. 37 is a partial cross-sectional view to illustrate the first step of an eighth embodiment of the method of manufacturing a non-volatile semiconductor memory device of the present invention.
Figure 38:
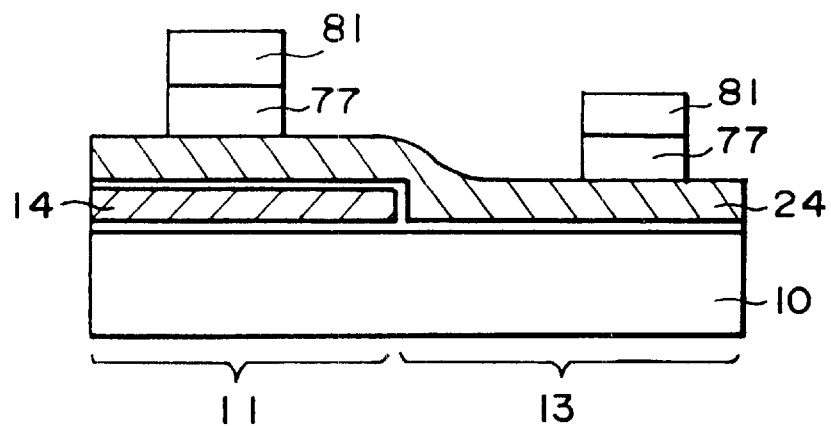
FIG. 38 is a partial cross-sectional view to illustrate the second step of the eighth embodiment of the method of manufacturing a non-volatile semiconductor memory device of the present invention.

The eighth embodiment of the present invention is described below. Referring to FIG. 37, the manufacturing steps up to the formation of the polysilicon layer 24 are performed as in the first embodiment. On the polysilicon layer 24, a silicon oxide layer 77 having a thickness of 200 to 300 nm is grown by means of a CVD method, for example. This silicon oxide layer 77 exemplifies the second insulation layer. A resist 81 as the sixteenth resist is formed on the silicon oxide layer 77 and provided with a desired pattern. Referring to FIG. 38, by using the resist 81 as a mask, the silicon oxide layer 77 is first selectively etched.

Figure 39:
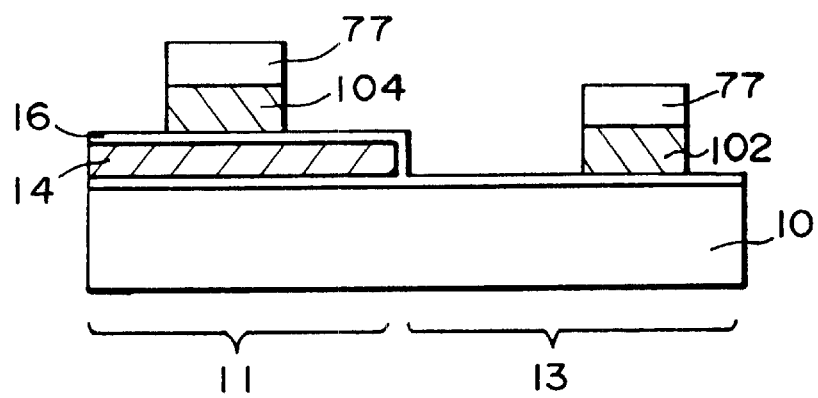
FIG. 39 is a partial cross-sectional view to illustrate the third step of the eighth embodiment of the method of manufacturing a non-volatile semiconductor memory device of the present invention.

After removing the resist 81 as shown in FIG. 39, the polysilicon layer 24 is selectively etched by using the silicon oxide layer 77 as a mask to simultaneously form a control gate 104 and a gate electrode 102.

Figure 40:
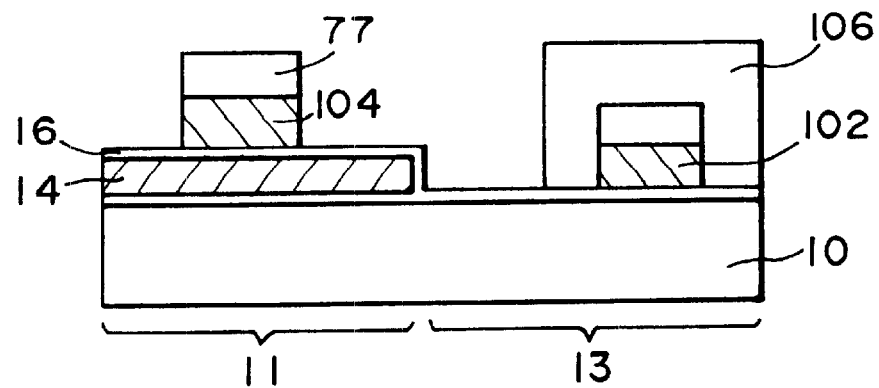
FIG. 40 is a partial cross-sectional view to illustrate the fourth step of the eighth embodiment of the method of manufacturing a non-volatile semiconductor memory device of the present invention.
Figure 41:
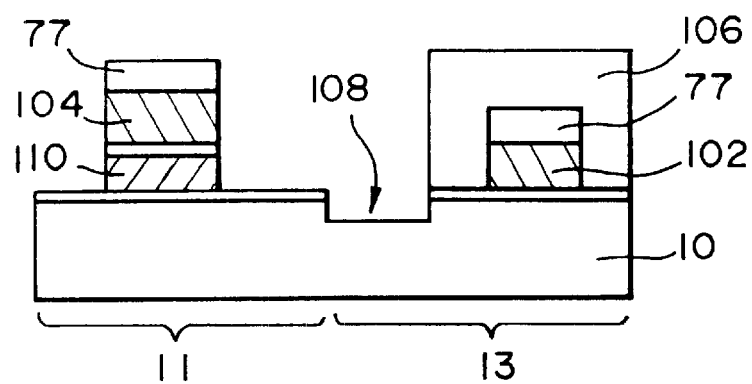
FIG. 41 is a partial cross-sectional view to illustrate the fifth step of the eighth embodiment of the method of manufacturing a non-volatile semiconductor memory device of the present invention.

As shown in FIG. 40, on the principal surface of the silicon substrate 10 a resist 106 is formed and patterned to cover the gate electrode 102. This resist corresponds to the seventeenth resist. Referring to FIG. 41, by using the silicon oxide layer 77 on the control gate 104 and the resist 106 as masks, the ONO-layer 16 and the polysilicon layer 14 are selectively etched in succession to form a floating gate 110. In this step, a groove section 108 is formed in the silicon substrate 10 in the area between the floating gate 110 and the gate electrode 102, in the same unavoidable manner as described in the first embodiment.

Figure 42:
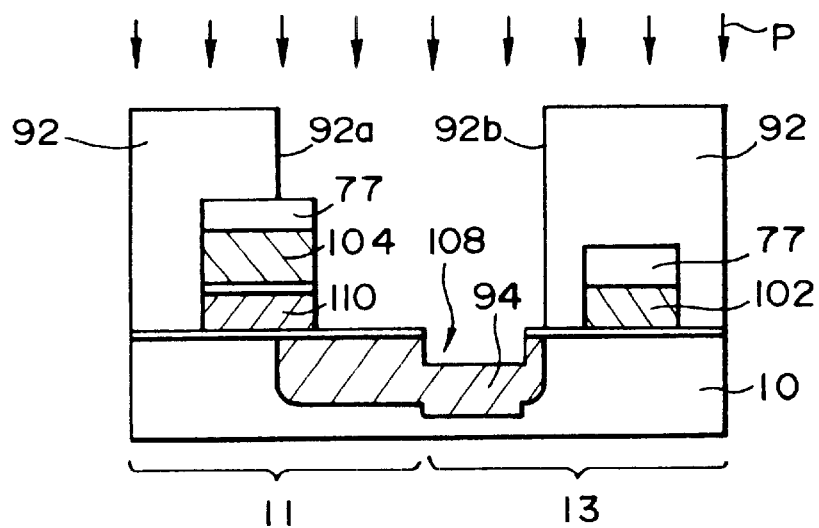
FIG. 42 is a partial cross-sectional view to illustrate the sixth step of the eighth embodiment of the method of manufacturing a non-volatile semiconductor memory device of the present invention.

Referring to FIG. 42, a resist 92 is formed on the principal surface of the silicon substrate 10. The resist 92 is patterned so as to cover the first region 11 for forming the first source/drain region while its side surface 92a is positioned on the control gate 104 and also covers the second region 13 on which the fourth source/drain region is formed while its side surface 92b is positioned between the gate electrode 102 and the groove section 108. The resist 92 thus provided to cover the first region 11 for forming the first source/drain region with its side surface 92a being positioned on the control gate 104 corresponds to the first resist. Meanwhile, the resist 92 provided to cover the second region 13 for forming the fourth source/drain region with its side surface 92b being positioned between the gate electrode 102 and the groove section 108 corresponds to the second resist. By using the resist 92 as a mask, the first ion implantation is performed on the silicon substrate 10, followed by a thermal treatment to form an N⁺ type region 94 covering the groove section 108. The conditions for the above ion implantation and the thermal treatment are the same as in the first embodiment.

Figure 43:
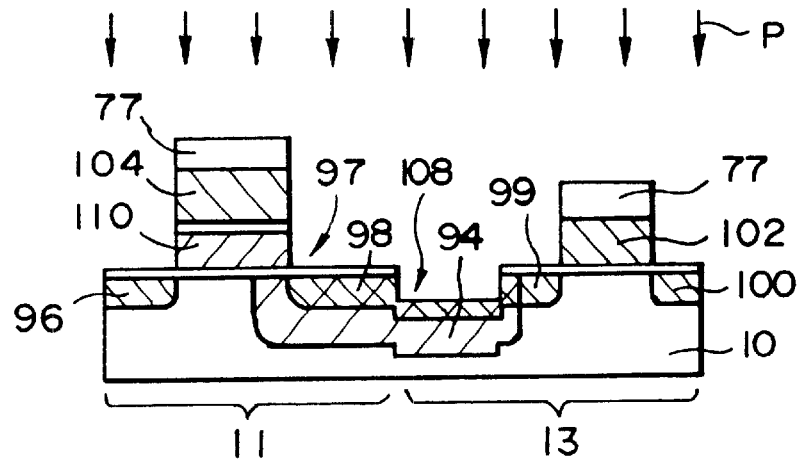
FIG. 43 is a partial cross-sectional view to illustrate the seventh step of the eighth embodiment of the method of manufacturing a non-volatile semiconductor memory device of the present invention.
Figure 44:
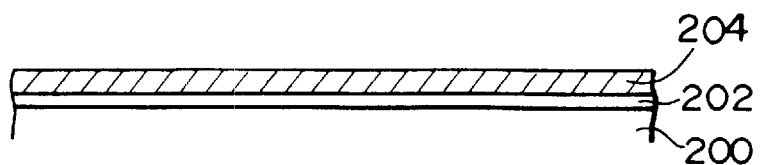
FIG. 44 is a partial cross-sectional view to illustrate the first step of a conventional method of manufacturing a non-volatile semiconductor memory device.
Figure 45:
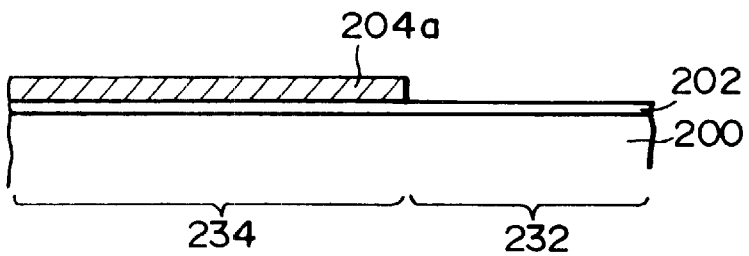
FIG. 45 is a partial cross-sectional view to illustrate the second step of a conventional method of manufacturing a non-volatile semiconductor memory device.
Figure 46:
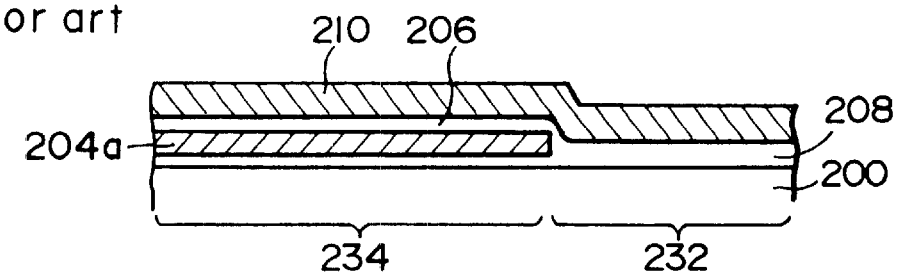
FIG. 46 is a partial cross-sectional view to illustrate the third step of a conventional method of manufacturing a non-volatile semiconductor memory device.
Figure 47:
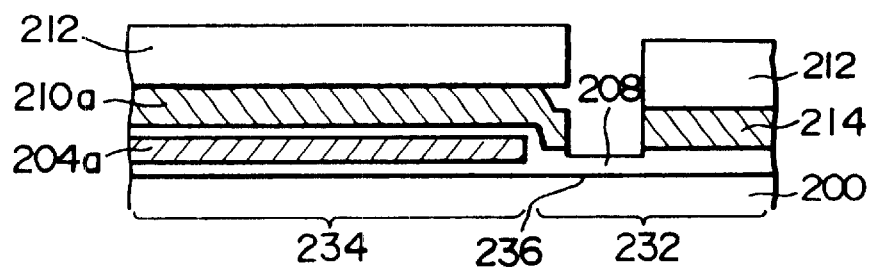
FIG. 47 is a partial cross-sectional view to illustrate the fourth step of a conventional method of manufacturing a non-volatile semiconductor memory device.
Figure 48:
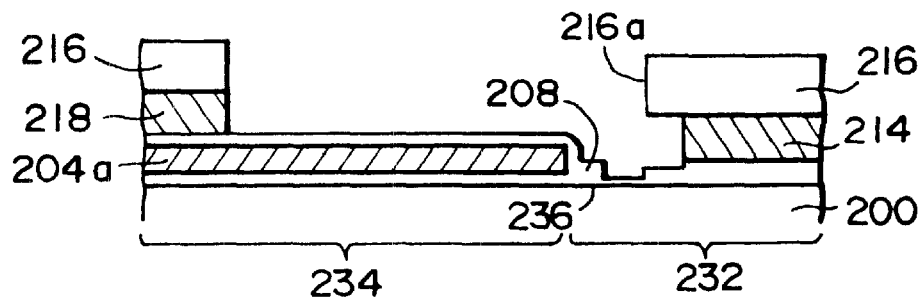
FIG. 48 is a partial cross-sectional view to illustrate the fifth step of a conventional method of manufacturing a non-volatile semiconductor memory device.
Figure 49:
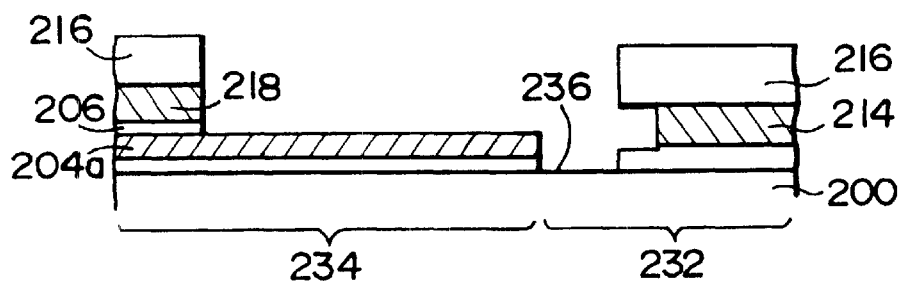
FIG. 49 is a partial cross-sectional view to illustrate the sixth step of a conventional method of manufacturing a non-volatile semiconductor memory device.
Figure 50:
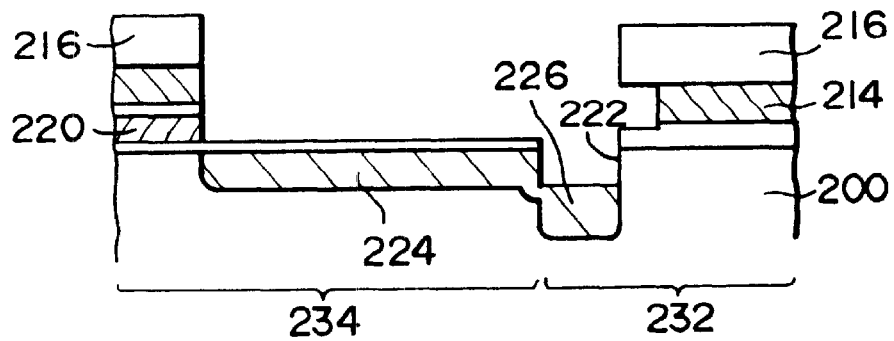
FIG. 50 is a partial cross-sectional view to illustrate the seventh step of a conventional method of manufacturing a non-volatile semiconductor memory device.
Figure 51:
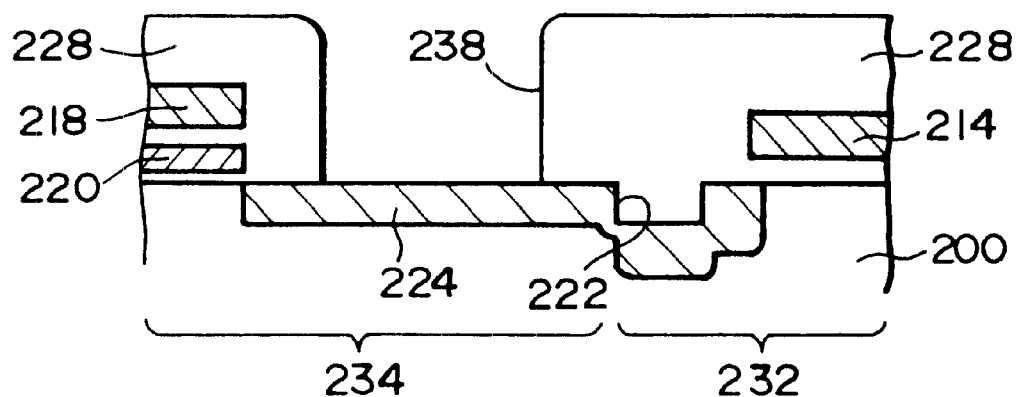
FIG. 51 is a partial cross-sectional view to illustrate the eighth step of a conventional method of manufacturing a non-volatile semiconductor memory device.
Figure 52:
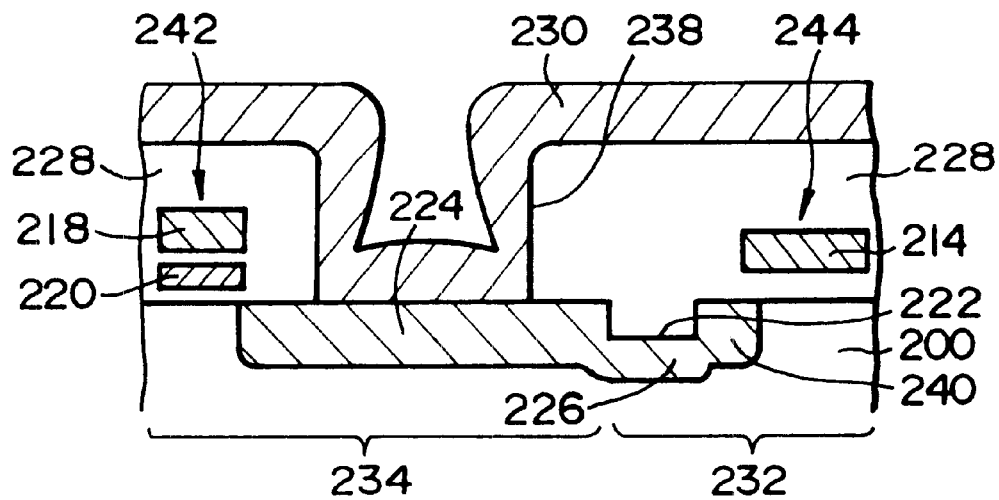
FIG. 52 is a partial cross-sectional view to illustrate the ninth step of a conventional method of manufacturing a non-volatile semiconductor memory device.

Next, referring to FIG. 43, the second ion implantation is performed on the principle surface of the silicon substrate 10 by using as masks the silicon oxide layer 77 on the control gate 104 and also the silicon oxide layer 77 on the gate electrode 102. After a subsequent thermal treatment, source/drain regions 96 and 100, as well as an N⁺ type region 98 covering the groove section 108 are formed. The conditions for the ion implantation are the same as in the first embodiment. Part of the N⁺ type regions 94 and 98 located in the first region 11 constitute the source/drain region 97 exemplifying the second source/drain region of the present invention. Part of the N⁺ type regions 98 located in the second region 13 constitutes the source/drain region 99 exemplifying the third source/drain region. The rest of the manufacturing steps are the same as in the first embodiment.

As shown in FIG. 39, this eighth embodiment forms the control gate 104 and the gate electrode 102 by using the silicon oxide layer 77 as the mask. Consequently, it is able to form the control gate and the gate electrode with a more accurate shape than a method for forming the same using a resist as the mask.

What is claimed is:

1. A method of manufacturing a non-volatile semiconductor memory device comprising:
   at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and
   at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween,
   wherein the manufacturing method comprising:
       a step of forming a tunnel insulation layer on the first region;
       a step of forming on the tunnel insulation layer a first conductive layer which becomes the floating gate;
       a step of forming a dielectric layer on the first conductive layer;
       a step of forming a gate insulation layer on the second region;
       a step of forming a second conductive layer on the dielectric layer and the gate insulation layer;
       a step of forming the control gate and the gate electrode by selectively etching the second conductive layer; and
       a step of forming the floating gate by selectively etching the first conductive layer,
       wherein, when the first conductive layer is selectively etched, the principal surface in the area between the floating gate and the gate electrode is also unavoidably etched to form a groove section, and
   wherein the manufacturing method further comprising:
       a step of performing a first ion implantation in the semiconductor substrate in a manner to cover the groove section so that a first impurity region is formed in the semiconductor substrate; and
       a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region,
       wherein the first and second ion implantations have the same conductivity type.

2. The method of manufacturing a non-volatile semiconductor memory device according to claim 1, the method further comprising, prior to the step of forming the tunnel insulation layer, a step of forming on the principal surface an element-isolating insulation layer that includes a side portion located in the first and second regions and isolates the memory element and the access gate transistor from other memory element and other access gate transistor,
   wherein the step of forming the first impurity region includes the first ion implantation using as a mask an eleventh resist that covers the element-isolating insulation layer, the side surface of the eleventh resist being positioned outside the side portion of the element-isolating insulation layer.

3. The method of manufacturing a non-volatile semiconductor memory device according to claim 2, wherein the distance from the side surface of the eleventh resist to the side portion of the element-isolating insulation layer is not less than 0.1 μm and not more than 0.3 μm.

4. The method of manufacturing a non-volatile semiconductor memory device according to claim 1, wherein serial steps for forming the second conductive layer up to forming the floating gate comprising:
   a step of forming a twelfth resist on the second conductive layer, after a step of forming the second conductive layer;
   a step of selectively etching the second conductive layer using the twelfth resist as a mask to leave a portion of the second conductive layer on the first region, and to form the gate electrode;
   a step of forming a thirteenth resist on the second conductive layer in the first region and to cover the gate electrode;
   a step of selectively etching the second conductive layer using the thirteenth resist as a mask to form the control gate; and
   a step of selectively etching the first conductive layer using the thirteenth resist as a mask to form the floating gate.

5. The method of manufacturing a non-volatile semiconductor memory device according to claim 1, wherein serial steps for forming the second conductive layer up to forming the floating gate comprising:
   a step of forming a first insulation layer on the second conductive layer, after a step of forming the second conductive layer;
   a step of forming a fourteenth resist on the first insulation layer; and
   a step of selectively etching the first insulation layer and the second conductive layer using the fourteenth resist as a mask to simultaneously form the control gate and the gate electrode,
   wherein the first insulation layer remains on the control gate and the gate electrode, and
   wherein the serial steps further include:
      a step of forming a fifteenth resist so as to cover the gate electrode; and
      a step of selectively etching the first conductive layer using the first insulation layer on the control gate and the fifteenth resist as masks to form the floating gate.

6. The method of manufacturing a non-volatile semiconductor memory device according to claim 1, wherein serial steps for forming the second conductive layer up to forming the floating gate comprising:
   a step of forming a second insulation layer on the second conductive layer, after a step of forming the second conductive layer;
   a step of forming a sixteenth resist on the second insulation layer;
   a step of selectively etching the second insulation layer using the sixteenth resist as a mask; and
   a step of selectively etching the second conductive layer using the second insulation layer as a mask to simultaneously form the control gate and the gate electrode,
   wherein the second insulation layer remains on the control gate and the gate electrode, and
   wherein the serial steps further include:
      a step of forming a seventeenth resist so as to cover the gate electrode; and
      a step of selectively etching the first conductive layer using the second insulation layer on the control gate and the seventeenth resist as masks to form the floating gate.

7. The method of manufacturing a non-volatile semiconductor memory device according to claim 1, wherein the non-volatile semiconductor memory device comprises a plurality of the memory elements and a plurality of the access gate transistors, each one of the access gate transistors selectively activating only one memory element.

8. A method of manufacturing a non-volatile semiconductor memory device comprising:
   at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and
   at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween,
   wherein the manufacturing method comprising:
      a step of forming a tunnel insulation layer on the first region;
      a step of forming on the tunnel insulation layer a first conductive layer which becomes the floating gate;
      a step of forming a dielectric layer on the first conductive layer;
      a step of forming a gate insulation layer on the second region;
      a step of forming a second conductive layer on the dielectric layer and the gate insulation layer;
      a step of forming the control gate and the gate electrode by selectively etching the second conductive layer; and
      a step of forming the floating gate by selectively etching the first conductive layer,
   wherein, when the first conductive layer is selectively etched, the principal surface in the area between the floating gate and the gate electrode is also unavoidably etched to form a groove section, and
   wherein the manufacturing method further comprising:
      a step of performing a first ion implantation in the semiconductor substrate in a manner to cover the groove section so that a first impurity region is formed in the semiconductor substrate; and
      a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, wherein:
         the first impurity region is formed by performing the first ion implantation using a first resist and a second resist as masks, the first resist covering the first region in which the first source/drain is formed; and a side surface of the first resist being positioned on the control gate, the second resist covering the second region in which the fourth source/drain is formed; and a side surface of the second resist being positioned between the gate electrode and the groove section;

the first, third, and fourth source/drain regions, and the second impurity regions are formed by performing the second ion implantation in the semiconductor substrate using the control gate and the gate electrode as masks; and the second source/drain region is formed by performing the first and the second ion implantations.

9. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:

a step of forming a tunnel insulation layer on the first region;

a step of forming on the tunnel insulation layer a first conductive layer which becomes the floating gate;

a step of forming a dielectric layer on the first conductive layer;

a step of forming a gate insulation layer on the second region;

a step of forming a second conductive layer on the dielectric layer and the gate insulation layer;

a step of forming the control gate and the gate electrode by selectively etching the second conductive layer; and a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:

a step of performing a first ion implantation in the semiconductor substrate in a manner to cover the groove section so that a first impurity region is formed in the semiconductor substrate; and a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, wherein:

the first impurity region is formed by performing the first ion implantation using a third resist and a fourth resist as masks, the third resist covering the first region in which the first source/drain region is formed; and a side surface of the third resist being positioned between the control gate and the groove section, the fourth resist covering the second region in which the fourth source/drain region is formed; and a side surface of the fourth resist being positioned between the gate electrode and the groove section; and the first, second, third, and fourth source/drain regions, and the second impurity regions are formed by performing the second ion implantation in the semiconductor substrate using the control gate and the gate electrode as masks.

10. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:

a step of forming a tunnel insulation layer on the first region;

a step of forming on the tunnel insulation layer a first conductive layer which becomes the floating gate;

a step of forming a dielectric layer on the first conductive layer;

a step of forming a gate insulation layer on the second region;

a step of forming a second conductive layer on the dielectric layer and the gate insulation layer;

a step of forming the control gate and the gate electrode by selectively etching the second conductive layer; and a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:

a step of performing a first ion implantation in the semiconductor substrate in a manner to cover the groove section so that a first impurity region is formed in the semiconductor substrate; and a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, wherein:

the first impurity region is formed by performing the first ion implantation using a fifth resist and a sixth resist as masks, the fifth resist covering the first region in which the first source/drain region is formed; and a side surface of the fifth resist being positioned on the control gate, the sixth resist covering the second region in which the fourth source/drain region is formed; and a side surface of the sixth resist being positioned on the gate electrode;

the first and fourth source/drain regions and the second impurity region are formed by performing the second ion implantation in the semiconductor substrate using the control gate and the gate electrode as masks; and the second and third source/drain regions are formed by performing the first and second ion implantations.

11. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:
a step of forming a tunnel insulation layer on the first region;
a step of forming on the tunnel insulation layer a first conductive layer which becomes the floating gate;
a step of forming a dielectric layer on the first conductive layer;
a step of forming a gate insulation layer on the second region;
a step of forming a second conductive layer on the dielectric layer and the gate insulation layer;
a step of forming the control gate and the gate electrode by selectively etching the second conductive layer; and
a step of forming the floating gate by selectively etching the first conductive layer,
wherein, when the first conductive layer is selectively etched, the principal surface in the area between the floating gate and the gate electrode is also unavoidably etched to form a groove section, and wherein the manufacturing method further comprising:
a step of performing a first ion implantation in the semiconductor substrate in a manner to cover the groove section so that a first impurity region is formed in the semiconductor substrate; and
a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, wherein:

the first impurity region is formed by performing the first ion implantation using a seventh resist and a eighth resist as masks, the seventh resist covering the first region in which the first source/drain region is formed; and a side surface of the seventh resist being positioned between the control gate and the groove section, the eighth resist covering the second region in which the fourth source/drain region is formed; and a side surface of the eighth resist being positioned on the gate electrode;

the first, second, and fourth source/drain regions and the second impurity region are formed by performing the second ion implantation in the semiconductor substrate using the control gate and the gate electrode as masks; and the third source/drain region is formed by performing the first and second ion implantations.

12. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:
a step of forming a tunnel insulation layer on the first region; a step of forming on the tunnel insulation layer a first conductive layer which becomes the floating gate;
a step of forming a dielectric layer on the first conductive layer;
a step of forming a gate insulation layer on the second region;
a step of forming a second conductive layer on the dielectric layer and the gate insulation layer;
a step of forming the control gate and the gate electrode by selectively etching the second conductive layer; and a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:

a step of performing a first ion implantation in the semiconductor substrate in a manner to cover the groove section so that a first impurity region is formed in the semiconductor substrate; and a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, wherein:

the first and second source/drain regions and the first impurity region are formed by performing the first ion implantation using the control gate and a ninth resist as masks, the ninth resist covering the second region in which the fourth source/drain region is formed; and a side surface of the ninth resist being positioned between the gate electrode and the groove section; and the third and fourth source/drain regions and the second impurity region are formed by performing the second ion implantation using the gate electrode and a tenth resist as masks, the tenth resist covering the first region in which the first source/drain region is formed; and a side surface of the tenth resist being positioned between the control gate and the groove section.

13. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source/drain region that is formed in the second region and is electrically connected to the second source/drain region; and a fourth source/drain region formed in the second region apart from the third source/drain region, located by the gate electrode therebetween, wherein the manufacturing method comprising:

a step of forming a tunnel insulation layer on the first region;

a step of forming on the tunnel insulation layer a first conductive layer which becomes the floating gate;

a step of forming a dielectric layer on the first conductive layer;

a step of forming a gate insulation layer on the second region;

a step of forming a second conductive layer on the dielectric layer and the gate insulation layer;

a step of forming the control gate and the gate electrode by selectively etching the second conductive layer; and a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:

a step of performing a first ion implantation in the semiconductor substrate in a manner to cover the groove section so that a first impurity region is formed in the semiconductor substrate; and a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region wherein:

the groove section is formed to a depth of between 100 to 300 nm;

the step for forming the first impurity region comprises:

the first ion implantation performed initially with phosphorus under conditions of an energy of 40 to 120 KeV and a dosage of $1E14/cm^2$ to $6E15/cm^2$, then with any one of phosphorus and arsenic under conditions of an energy of 30 to 80 KeV and a dosage of $1E15/cm^2$ to $6E15/cm^2$; and a step of thermally treating the implanted ion under $N_2$ or $N_2/O_2$ atmosphere, at a temperature between 900 and 950° C., and for a duration of 30 to 180 minutes to form the first impurity region having a thickness of 200 to 600 nm and an impurity concentration of $1E18/cm^3$ to $1E21/cm^3$; and the step for forming the second impurity region comprises:

the second ion implantation performed initially with phosphorus under conditions of an energy of 40 to 120 KeV and a dosage of $5E12/cm^2$ to $5E14/cm^2$, then with any one of phosphorus and arsenic under conditions of an energy of 30 to 80 KeV and a dosage of $1E15/cm^2$ to $6E15/cm^2$; and a step of forming the second impurity region having a thickness of 100 to 400 nm and an impurity concentration of $1E17/cm^3$ to $1E21/cm^3$.

14. A method of manufacturing a non-volatile semiconductor memory device comprising:

at least one memory element including: a semiconductor substrate having a principal surface comprising a first region and a second region; a floating gate formed on the first region; a control gate formed on the floating gate; a first source/drain region formed in the first region; and a second source/drain region formed in the first region apart from the first source/drain region, located by the floating gate and the control gate therebetween; and at least one access gate transistor for selectively activating the memory element, the access gate transistor comprising: a gate electrode formed on the second region; a third source drain region that is formed in the second region and is electrically connected to the second source/drain region; and a fourth source/drain region formed in the second region apart from the third source/drain region, located by the gate electrode therebetween, wherein the manufacturing method comprising:
- a step of forming a tunnel insulation layer on the first region;
- a step of forming on the tunnel insulation layer a first conductive layer which becomes the floating gate;
- a step of forming a dielectric layer on the first conductive layer;
- a step of forming a gate insulation layer on the second region;
- a step of forming a second conductive layer on the dielectric layer and the gate insulation layer;
- a step of forming the control gate and the gate electrode by selectively etching the second conductive layer; and
- a step of forming the floating gate by selectively etching the first conductive layer, wherein, when the first conductive layer is selectively etched, the principal surface in the area between the floating gate and the gate electrode is also unavoidably etched to form a groove section, and wherein the manufacturing method further comprising:
- a step of performing a first ion implantation in the semiconductor substrate in a manner to cover the groove section so that a first impurity region is formed in the semiconductor substrate;
- a step of performing a second ion implantation in the semiconductor substrate in a manner to cover the groove section so that a second impurity region and at least one of the first, second, third, and fourth source/drain regions are formed in the semiconductor substrate, the second impurity region overlapping with the first impurity region at the groove section, the second source/drain region and the third source/drain region being electrically connected by the first impurity region and the second impurity region, and
- at least one of the second and third source/drain regions is formed with a required thickness and concentration of impurity, wherein the first and second ion implantations have the same conductivity type.

* * * * *